(12) United States Patent
Cho et al.

(10) Patent No.: US 11,804,181 B2
(45) Date of Patent: Oct. 31, 2023

(54) DISPLAY DEVICE AND DRIVING METHOD FOR THE SAME

(71) Applicant: LG DISPLAY CO., LTD., Seoul (KR)

(72) Inventors: Youngsung Cho, Paju-si (KR); Byeong-Seong So, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/952,032

(22) Filed: Sep. 23, 2022

(65) Prior Publication Data

US 2023/0196999 A1 Jun. 22, 2023

(30) Foreign Application Priority Data

Dec. 16, 2021 (KR) .......................... 10-2021-0180429

(51) Int. Cl.
*G09G 3/32* (2016.01)
*G09G 3/3233* (2016.01)
*G09G 3/3266* (2016.01)
*G09G 3/3275* (2016.01)
*H10K 59/124* (2023.01)

(52) U.S. Cl.
CPC ......... *G09G 3/3233* (2013.01); *G09G 3/3266* (2013.01); *G09G 3/3275* (2013.01); *H10K 59/124* (2023.02); *G09G 2300/0819* (2013.01); *G09G 2300/0842* (2013.01); *G09G 2300/0861* (2013.01); *G09G 2310/08* (2013.01); *G09G 2330/021* (2013.01); *G09G 2354/00* (2013.01)

(58) Field of Classification Search
CPC .. G09G 3/3233; G09G 3/3266; G09G 3/3275; G09G 2300/0819; G09G 2300/0842; G09G 2300/0861; G09G 2310/08; G09G 2330/021; G09G 2354/00; H10K 59/124
USPC .......................................................... 345/78
See application file for complete search history.

(56) References Cited

U.S. PATENT DOCUMENTS

2016/0042694 A1* 2/2016 Lim ...................... G09G 3/3233
345/78

* cited by examiner

*Primary Examiner* — Abdul-Samad A Adediran
(74) *Attorney, Agent, or Firm* — Fenwick & West LLP

(57) ABSTRACT

A display device includes: a display panel including a plurality of data lines, a plurality of gate lines, and a plurality of pixels connected to the plurality of data lines and the plurality of gate lines; a data driving circuit configured to supply data signals to the plurality of data lines; a gate driving circuit configured to supply gate signals to the plurality of gate lines; and a power supply circuit configured to supply a first body voltage and a second body voltage having a voltage level that is less than the first body voltage to the plurality of pixels, the plurality of pixels being selectively supplied with the first body voltage and the second body voltage.

20 Claims, 23 Drawing Sheets

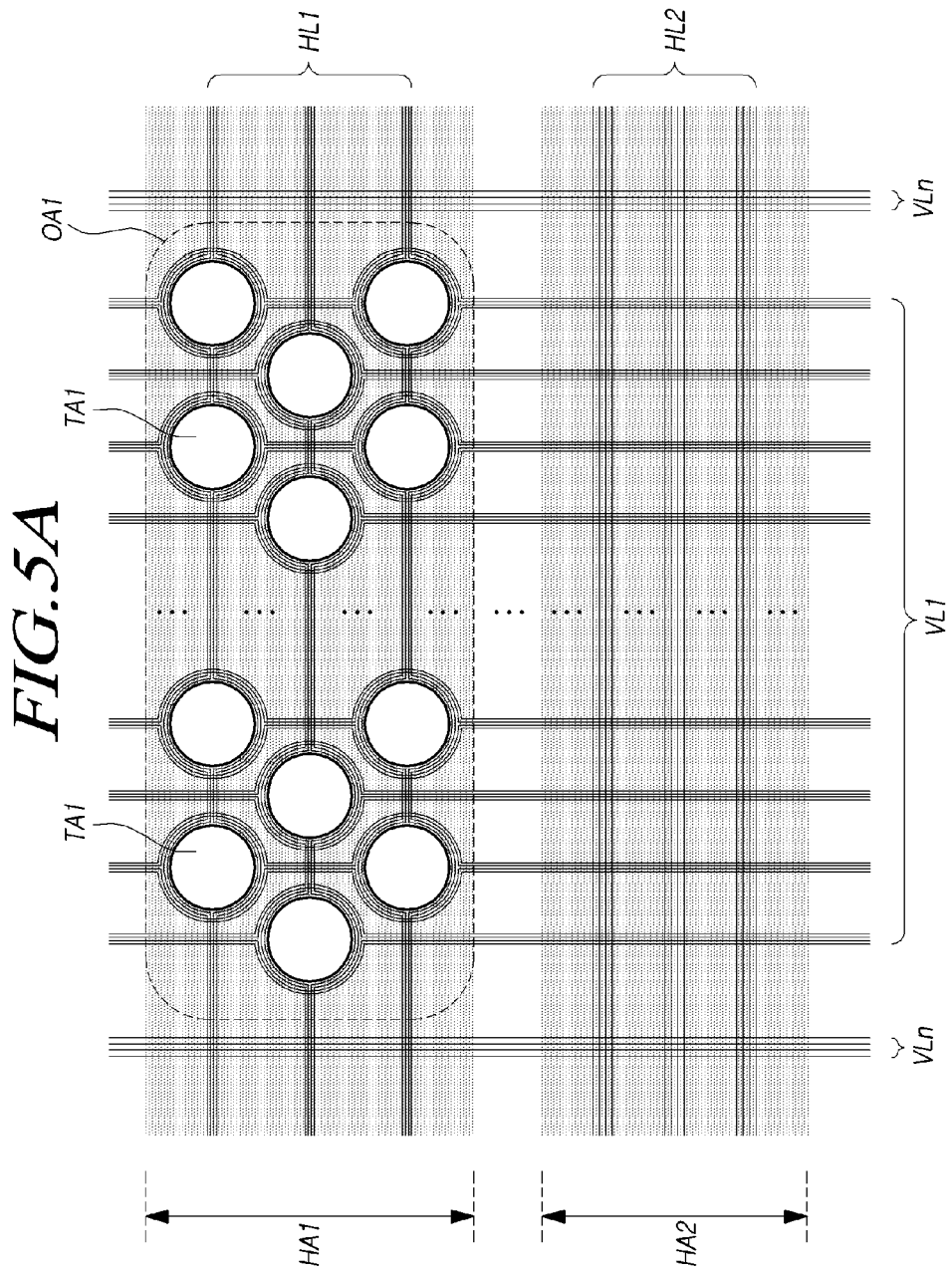

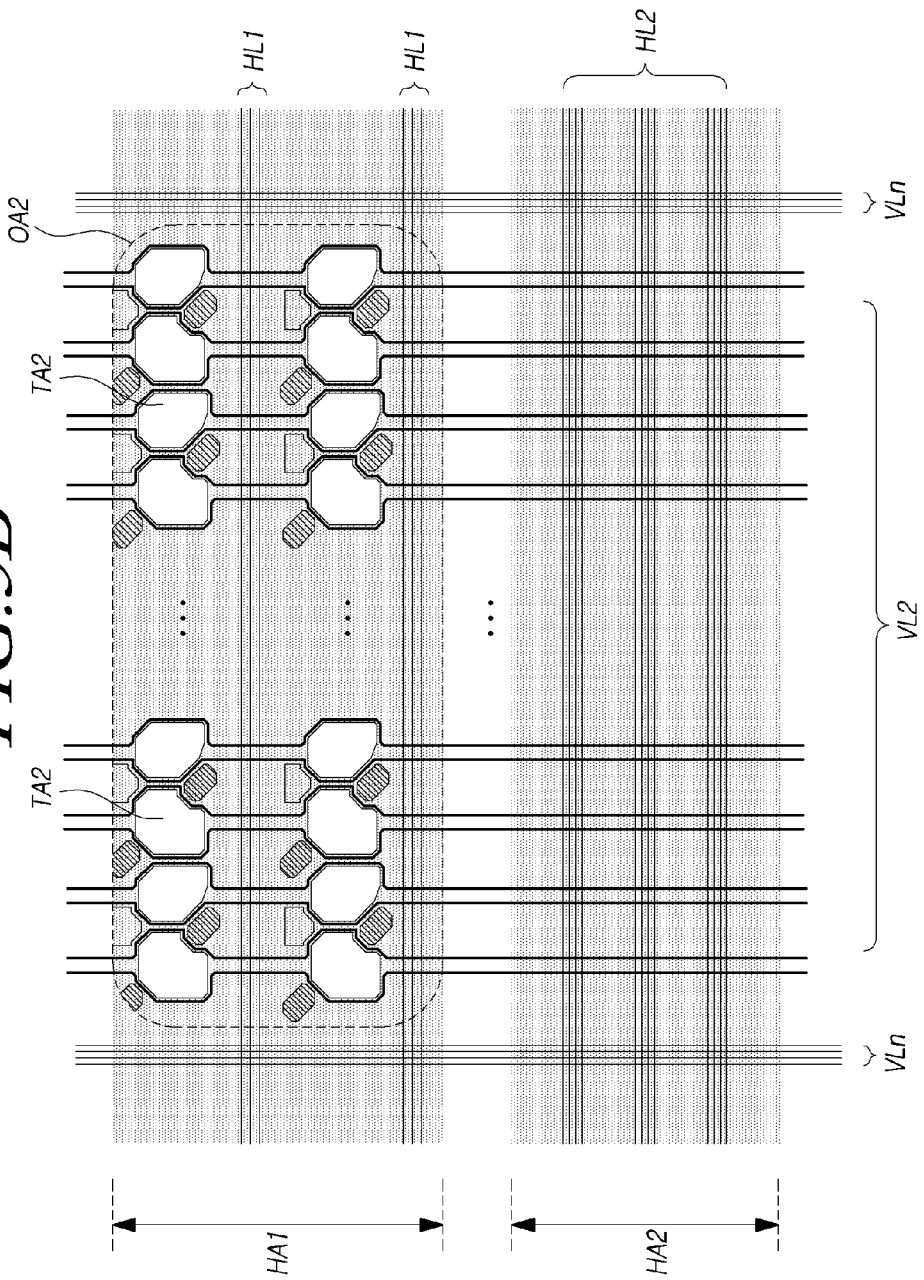

DISPLAY DEVICE AND DRIVING METHOD FOR THE SAME

CROSS-REFERENCE TO RELATED APPLICATION

This application claims the priority benefit of Republic of Korea Patent Application No. 10-2021-0180429, filed on Dec. 16, 2021 in the Korean Intellectual Property Office, which is hereby incorporated by reference in its entirety.

BACKGROUND

Technical Field

The present disclosure relates to electronic devices, and more specifically, to a display device and a method of driving the display device.

Description of the Related Art

As the information-oriented society has been developed, various needs for display devices for displaying an image have increased. To satisfy such needs, various types of display devices, such as a liquid crystal display (LCD) device, an electroluminescence display (ELD) device, and the like have been developed and utilized.

The ELD device may include a quantum-dot light emitting display device including a quantum dot (QD), an inorganic light emitting display device, and an organic light emitting display device, and the like.

Among these display devices, the ELD device has characteristics of a short response time, a wide viewing angle, excellent color gamut, and the like. Further, the ELD device has an advantage that can be implemented in a thin package or structure.

Further, since the ELD device displays an image through light emitted by a driving current, an amount of driving current is small or the driving current does not flow at a low gray scale or a black gray scale. Thus, the ELD device has advantages of high contrast ratio at low luminance, excellent image quality, and the like.

Electronic devices including the various types of display devices tend to employ a large number of sensors and devices to implement various applications. In particular, an electronic device may include a camera receiving light, and a sensor receiving and/or emitting light.

Recently, in order to realize a thin bezel of a display device, there have been developed display devices in which a camera receiving light, and a sensor receiving and/or emitting light are disposed to overlap a display area of a display panel.

SUMMARY

One or more embodiments of the present disclosure may provide a display device having a narrow bezel without the deterioration of quality of images displayed, and a method of driving the display device.

According to one or more embodiments of the present disclosure, a display device and a method of driving the display device can be provided for realizing a narrow bezel without the deterioration of quality of images displayed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 5A illustrates example arrangements of signal lines in each of a first optical area and a normal area in the display panel according to embodiments of the present disclosure;

FIG. 5B illustrates example arrangements of signal lines in each of a second optical area and the normal area in the display panel according to embodiments of the present disclosure;

DETAILED DESCRIPTION

Figure 1A:
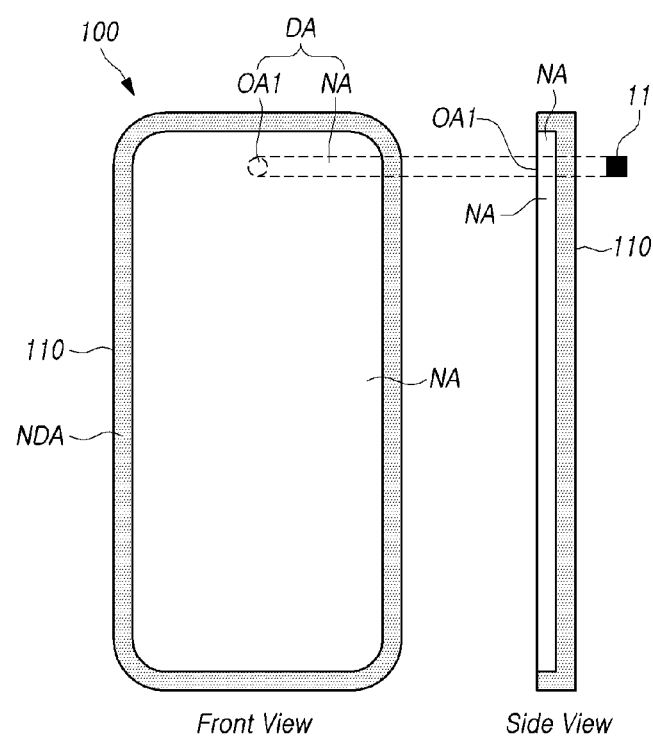
FIGS. 1A, 1B and 1C are plan views illustrating an example display device according to embodiments of the present disclosure.

Reference will now be made in detail to embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)," is used.

In construing an element, the element is to be construed as including an error or tolerance range even where no explicit description of such an error or tolerance range is provided. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Figure 1B:
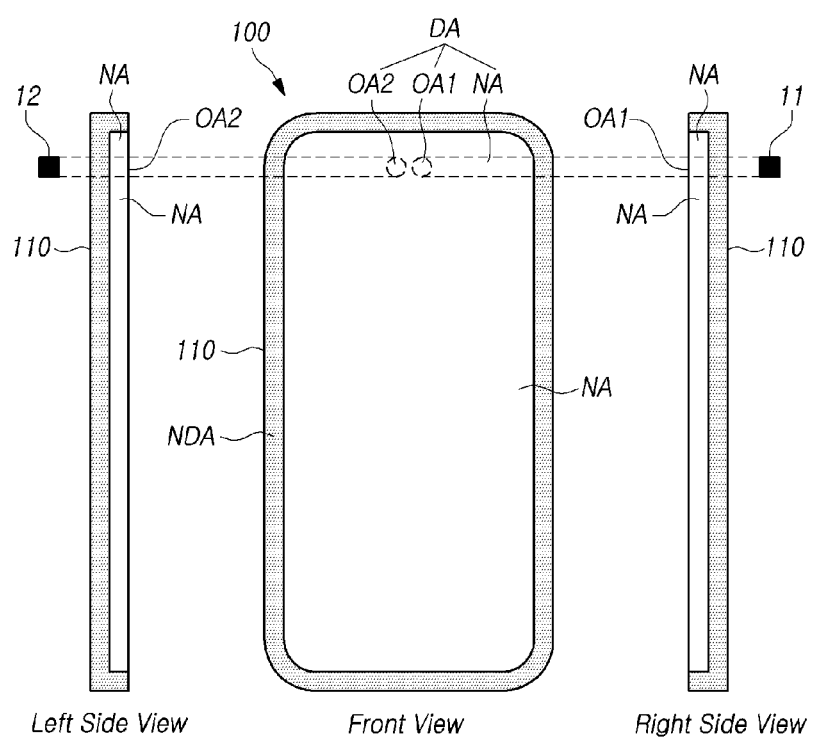
Figure 1C:
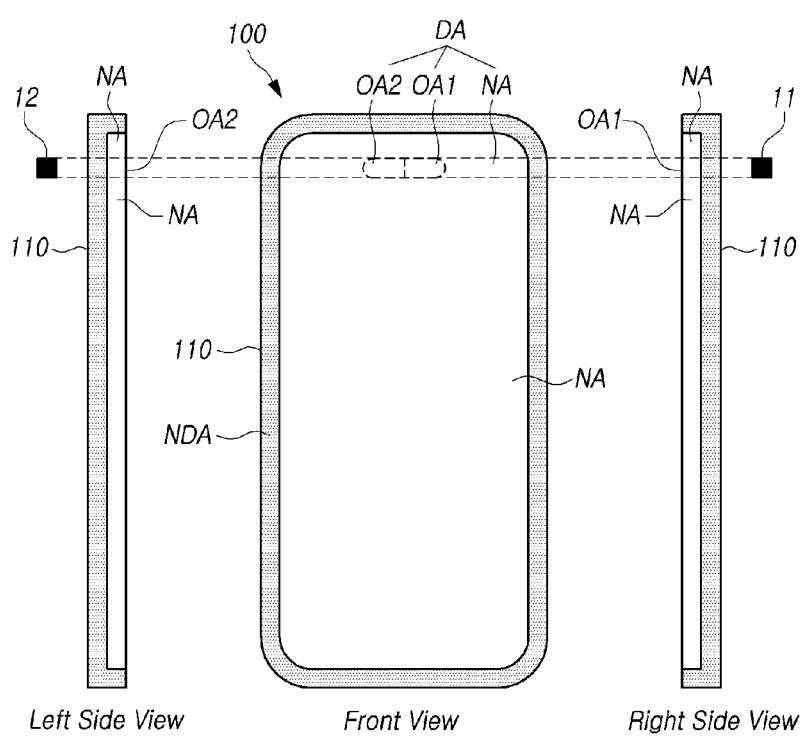

FIGS. 1A, 1B and 1C are plan views illustrating an example display device according to embodiments of the present disclosure.

Referring to FIGS. 1A, 1B, and 1C, a display device 100 according to embodiments of the present disclosure may include a display panel 110 for displaying an image, and one or more optical electronic devices (11, 12). Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which an image is displayed and a non-display area NDA in which an image is not displayed.

A plurality of pixels can be arranged in the display area DA, and several types of signal lines for driving the plurality of pixels can be arranged therein.

The non-display area NDA may refer to an area outside of the display area DA. Several types of signal lines may be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, and 1C, in the display device 100 according to embodiments of the present disclosure, the one or more optical electronic devices (11, 12) may be located under, or in a lower portion of, the display panel 110 (an opposite side to the viewing surface thereof).

Light can enter the front surface (viewing surface) of the display panel 110, pass through the display panel 110, reach one or more optical electronic devices (11, 12) located under, or in the lower portion of, the display panel 110 (the opposite side of the viewing surface).

The one or more optical electronic devices (11, 12) can receive or detect light transmitting through the display panel 110 and perform a predefined function based on the received light. For example, the one or more optical electronic devices (11, 12) may include one or more of the following: an image capture device such as a camera (an image sensor), and/or the like, or a sensor such as a proximity sensor, an illuminance sensor, and/or the like.

Referring to FIGS. 1A, 1B, and 1C, in the display panel 110 according to embodiments of the present disclosure, the display area DA may include one or more optical areas (OA1, OA2) and a normal area NA. In one embodiment, the term "normal area" NA is an area that while being present in the display area DA, does not overlap with one or more optical electronic devices (11, 12) and may also be referred to as a non-optical area.

Referring to FIGS. 1A, 1B, and 1C, the one or more optical areas (OA1, OA2) may be one or more areas overlapping the one or more optical electronic devices (11, 12).

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In the example of FIG. 1B, at least a portion of the normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In some embodiments, an image display structure and a light transmission structure are desirable to be formed in the one or more optical areas (OA1, OA2). For example, since the one or more optical areas (OA1, OA2) are a portion of the display area DA, therefore, subpixels for displaying an image are needed to be disposed in the one or more optical areas (OA1, OA2). Further, to enable light to transmit the one or more optical electronic devices (11, 12), a light transmission structure is needed, and thus is formed in the one or more optical areas (OA1, OA2).

Even though the one or more optical electronic devices (11, 12) are needed to receive or detect light, the one or more optical electronic devices (11, 12) may be located on the back of the display panel 110 (e.g., on an opposite side of a viewing surface). In this embodiment, the one or more optical electronic devices (11, 12) are located, for example, under, or in a lower portion of, the display panel 110, and is configured to receive light that has transmitted the display panel 110.

For example, the one or more optical electronic devices (11, 12) are not exposed in the front surface (viewing surface) of the display panel 110. Accordingly, when a user faces the front surface of the display panel 110, the one or more optical electronic devices (11, 12) are invisible to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit including at least one of the camera lens and the image sensor. The sensor may be, for example, an infrared sensor capable of detecting infrared rays.

In another embodiment, the first optical electronic device 11 may be a sensor, and the second optical electronic device 12 may be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit including at least one of the camera lens and the image sensor.

In the example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1, OA2) included in the display area DA in each of FIGS. 1A, 1B, and 1C are areas where images can be displayed, the normal area NA is an area that lacks a light transmission structure, but the one or more optical areas (OA1, OA2) are areas that include the light transmission structure. Thus, in some embodiments, the normal area NA is an area that lacks a light transmission structure, and the one or more optical areas (OA1, OA2) are areas that include the light transmission structure.

Accordingly, the one or more optical areas (OA1, OA2) may have a transmittance greater than or equal to a predetermined level, (e.g., a relatively high transmittance), and the normal area NA may not have light transmittance or have a transmittance less than the predetermined level (e.g., a relatively low transmittance).

For example, the one or more optical areas (OA1, OA2) may have a resolution, a subpixel arrangement structure, the number of subpixels per unit area, an electrode structure, a line structure, an electrode arrangement structure, a line arrangement structure, or/and the like different from that/those of the normal area NA.

In an embodiment, the number of subpixels per unit area in the one or more optical areas OA1, OA2 may be less than the number of subpixels per unit area in the normal area NA. For example, the resolution of the one or more optical areas (OA1, OA2) may be less than that of the normal area NA. Here, the number of pixels per unit area may be used as a unit for measuring resolution, and measured using pixels per inch (PPI), which represents the number of pixels within 1 inch.

In an embodiment, in each of FIGS. 1A to 1C, the number of pixels per unit area in the first optical area OA1 may be less than the number of pixels per unit area in the normal area NA. In an embodiment, in each of FIGS. 1B and 1C, the number of pixels per unit area in the second optical area OA2 may be greater than or equal to the number of pixels per unit area in the first optical area OA1.

In each of FIGS. 1A, 1B, and 1C, the first optical area OA1 may have various shapes, such as a circle, an ellipse, a quadrangle, a hexagon, an octagon or the like. In each of FIGS. 1B, and 1C, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

In examples where the display device 100 according to aspects of the present disclosure has a structure in which the first optical electronic device 11 such as a camera, and the like. is located under, or in a lower portion of, the display panel 110 without being exposed to the outside, such a display device 100 according to aspects of the present disclosure may be referred to as a display in which under-display camera (UDC) technology is implemented.

According to these examples, the display device 100 according to aspects of the present disclosure can have an advantage of preventing the size of the display area DA from being reduced because a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11, 12) are located on the back of (e.g., under, or in a lower portion of) the display panel 110 of the display device 100 (e.g., hidden or not to be exposed to the outside), the one or more optical electronic devices (11, 12) are needed to perform normal predefined functionalities, and thus, receive or detect light.

Further, in the display device 100 according to aspects of the present disclosure, although one or more optical electronic devices (11, 12) are located on the back of (e.g., under, or in a lower portion of) the display panel 110 to be hidden and located to be overlap the display area DA, it is necessary for image display to be normally performed in the one or more optical areas (OA1, OA2) overlapping the one or more optical electronic devices (11, 12) in the area DA. Thus, in one or more examples, even though one or more optical electronic devices 11 and 12 are located on the back of the display panel, images can be displayed in a normal manner (e.g., without reduction in image quality) in the one or more optical areas OA1 and OA2 overlapping the one or more optical electronic devices 11 and 12 in the area DA.

Figure 2:
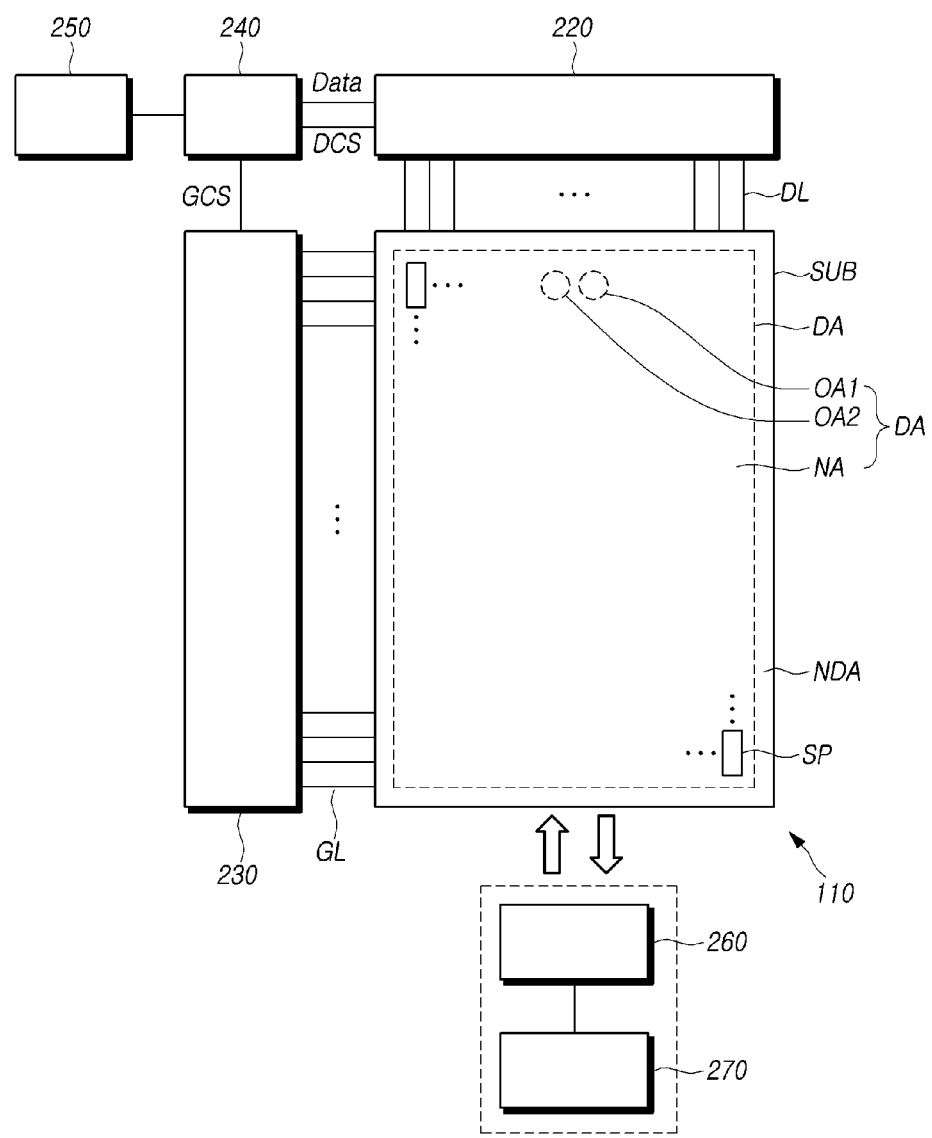
FIG. 2 illustrates an example system configuration of the display device according to embodiments of the present disclosure.

FIG. 2 illustrates an example system configuration of the display device 100 according to embodiments of the present disclosure.

Referring to FIG. 2, the display device 100 may include the display panel 110 and a display driving circuit as components for displaying an image.

The display driving circuit is a circuit for driving the display panel 110, and may include a data driving circuit 220, a gate driving circuit 230, a display controller 240, and other components.

The display panel 110 may include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 may include a substrate SUB and a plurality of pixels SP disposed on the substrate SUB. The display panel 110 may further include various types of signal lines to drive the plurality of pixels SP.

In some embodiments, the display device 100 herein may be a liquid crystal display device, or the like, or a self-emission display device in which light is emitted from the display panel 110 itself. In the example where the display device 100 according to aspects of the present disclosure is the self-emission display device, each of the plurality of pixels SP may include a light emitting element.

In one embodiment, the display device 100 according to embodiments of the present disclosure may be an organic light emitting display device in which the light emitting element is implemented using an organic light emitting diode (OLED). In another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of pixels SP may vary according to types of the display devices 100. In the example where the display device 100 is a self-emission display device including self-emission pixels SP, each pixel SP may include a self-emission light emitting element, one or more transistors, and one or more capacitors.

The various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction.

For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 may be a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can supply data signals to the plurality of data lines DL according to driving timing control of the display controller 240.

The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

In some embodiments, at least one of the data driving circuit 220 and the gate driving circuit 230 may be disposed in the display area DA of the display panel 110. For example, at least one of the data driving circuit 220 and the gate driving circuit 230 may be disposed not to overlap pixels SP, or disposed to be overlapped with one or more, or all, of the pixels SP.

The data driving circuit 220 may also be located on, but not limited to, only one side or portion (e.g., an upper edge or a lower edge) of the display panel 110. In some embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In some embodiments, the gate driving circuit 230 may be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In some embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the data driving circuit 220 and the gate driving circuit 230 through the printed circuit board, flexible printed circuit, and/or the like.

The display controller 240 may transmit signals to, and receive signals from, the data driving circuit 220 via one or more predefined interfaces. In some embodiments, such interfaces may include a low voltage differential signaling (LVDS) interface, an embedded clock point-point interface (EPI), a serial peripheral interface (SPI), and the like.

In some embodiments, in order to further provide a touch sensing function, as well as an image display function, the display device 100 may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where the add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In the example where the touch sensor is implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing method or a mutual-capacitance sensing method.

In the example where the touch sensing circuit performs touch sensing in the self-capacitance sensing method, the touch sensing circuit can perform touch sensing based on capacitance between each touch electrode and a touch object (e.g., a finger, a pen, and the like).

According to the self-capacitance sensing method, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing in the mutual-capacitance sensing method, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

In some embodiments, the display device 100 may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel 110 may include a normal area NA and one or more optical areas (OA1, OA2), for example, as shown in FIGS. 1A, 1B, and 1C.

The normal area NA and the one or more optical areas (OA1, OA2) are areas where an image can be displayed. However, the normal area NA is an area in which a light transmission structure need not be implemented, and the one or more optical areas (OA1, OA2) are areas in which the light transmission structure need be implemented.

As discussed above with respect to the examples of FIGS. 1A, 1B, and 1C, although the display area DA of the display panel 110 may include the one or more optical areas (OA1, OA2) in addition to the normal area NA, for convenience of description, in the discussion that follows, it is assumed that the display area DA includes first and second optical areas (OA1, OA2) and the normal area NA, and the normal area NA thereof includes the normal areas NAs in FIGS. 1A to 1C, and the first and second optical areas (OA1, OA2) thereof include the first optical areas OA1s in FIGS. 1A, 1B, and 1C and the second optical areas OA2s of FIGS. 1B and 1C, respectively, unless explicitly stated otherwise.

Figure 3:
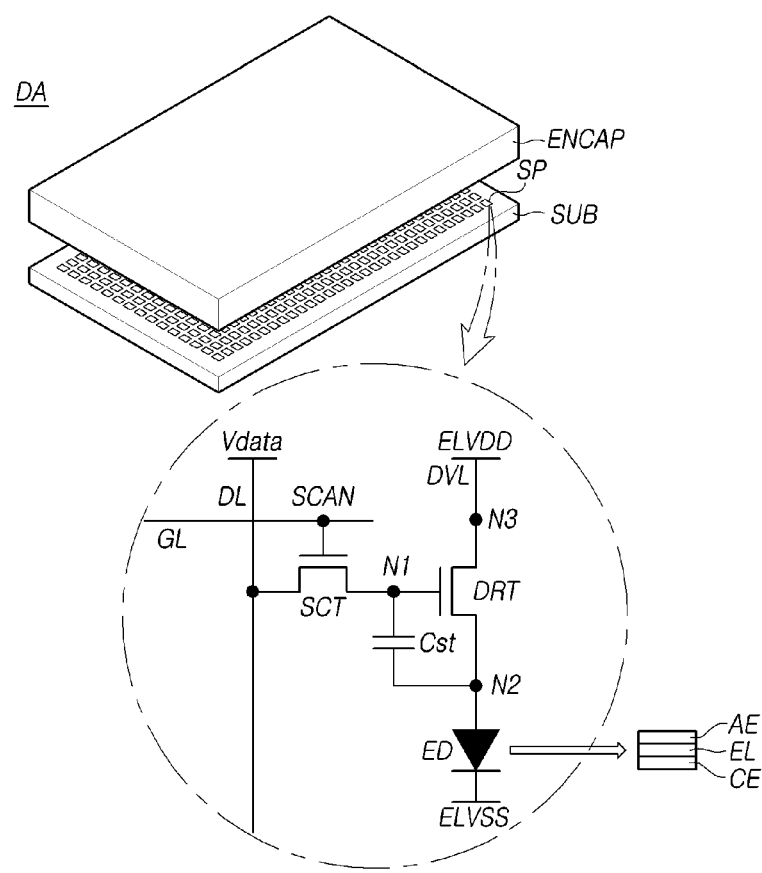
FIG. 3 illustrates an example equivalent circuit of a pixel in a display panel according to embodiments of the present disclosure.

FIG. 3 illustrates an example equivalent circuit of a pixel SP in the display panel 110 according to embodiments of the present disclosure.

Each of pixels SP disposed in the non-optical area NA, the first optical area OA1, and the second optical area OA2 included in the display area DA of the display panel 110 may include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT can include the first node N1 to which a data voltage is applied, a second node N2 electrically connected to the light emitting element ED, and a third node N3 to which a pixel driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED can include an anode electrode AE, an emission layer EL, and a cathode electrode CE. The anode electrode AE may be a pixel electrode disposed in each pixel SP, and may be electrically connected to the second node N2 of the driving transistor DRT of each pixel SP. The cathode electrode CE may be a common electrode commonly disposed in the plurality of pixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each pixel SP may include two transistors (2T: DRT and SCT) and one capacitor (1C: Cst) (which may be referred to as a "2T1C structure") as shown in FIG. 3, and in some cases, may further include one or more transistors, or further include one or more capacitors.

In some embodiments, the storage capacitor Cst, which may be present between the first node N1 and the second node N2 of the driving transistor DRT, may be an external capacitor intentionally configured or designed to be located outside of the driving transistor DRT, other than internal capacitors, such as parasitic capacitors (e.g., a gate-to-source capacitance Cgs, a gate-1to-drain capacitance Cgd, and the like).

Each of the driving transistor DRT and the scan transistor SCT may be an n-type transistor or a p-type transistor.

Since circuit elements (e.g., in particular, a light emitting element ED) in each pixel SP are vulnerable to external moisture or oxygen, an encapsulation layer ENCAP may be disposed in the display panel 110 in order to prevent the external moisture or oxygen from penetrating into the circuit elements (e.g., in particular, the light emitting element ED). The encapsulation layer ENCAP may be disposed to cover the light emitting element ED.

Figure 4:
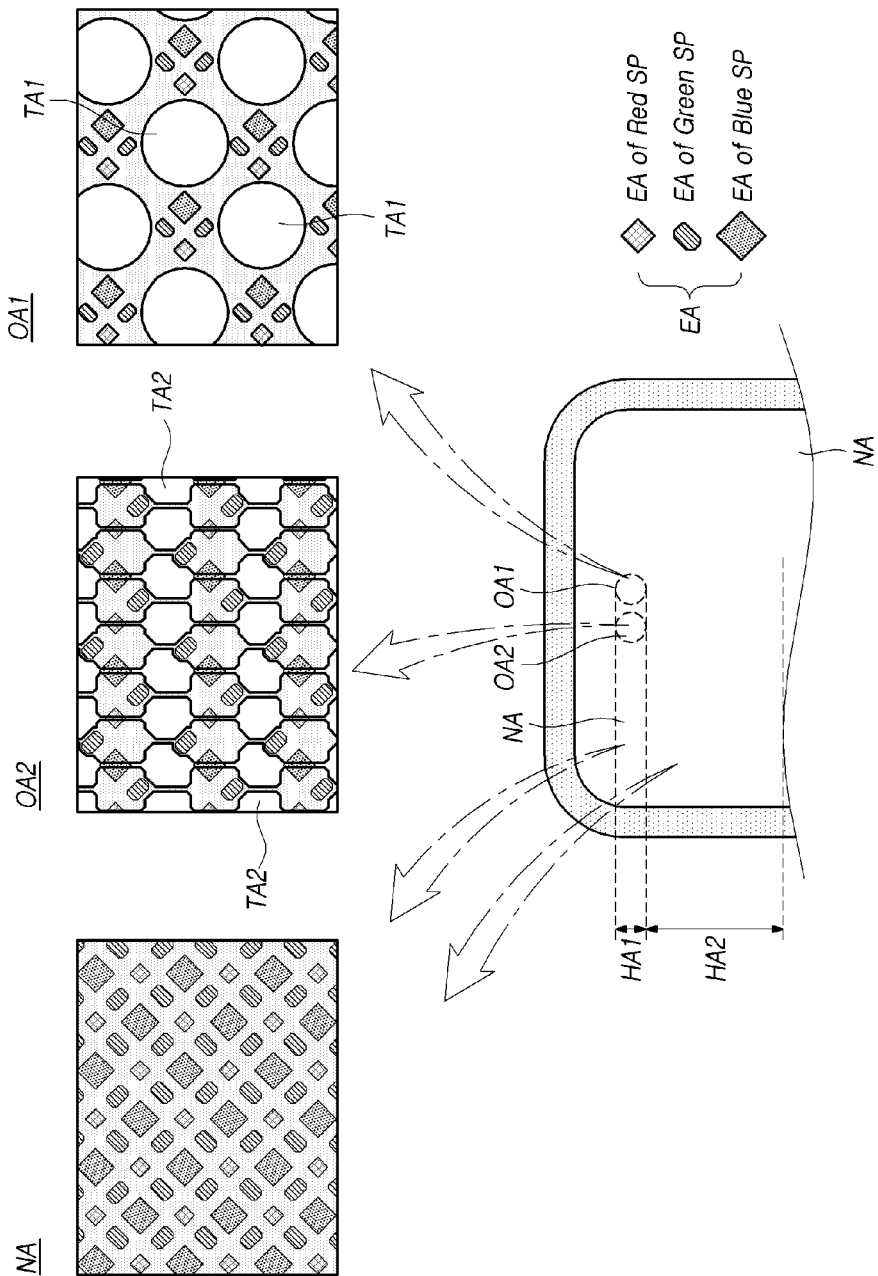
FIG. 4 illustrates example arrangements of pixels in three areas included in a display area of the display panel according to embodiments of the present disclosure.

FIG. 4 illustrates example arrangements of subpixels SP in the three areas (NA, OA1, and OA2) included in the display area DA of the display panel 110 according to embodiments of the present disclosure.

Referring to FIG. 4, a plurality of pixels SP may be disposed in each of the non-optical area NA, the first optical area OA1, and the second optical area OA2 included in the display area DA.

The plurality of pixels SP may include, for example, a red pixel (Red SP) emitting red light, a green pixel (Green SP) emitting green light, and a blue pixel (Blue SP) emitting blue light.

Accordingly, each of the non-optical area NA, the first optical area OA1, and the second optical area OA2 may include one or more light emitting areas EA of one or more red pixels (Red SP), and one or more light emitting areas EA of one or more green pixels (Green SP), and one or more light emitting areas EA of one or more blue pixels (Blue SP).

Referring to FIG. 4, in some embodiments, the normal area NA may not include a light transmission structure, but may include light emitting areas EA.

In contrast, in some embodiments, the first optical area OA1 and the second optical area OA2 need to include both the light emitting areas EA and the light transmission structure.

Accordingly, the first optical area OA1 can include light emitting areas EA and first transmission areas TA1 (e.g., light transmission areas), and the second optical area OA2 can include the light emitting areas EA and second transmission area TA2 (e.g., light transmission areas).

The light emitting areas EA and the transmission areas (TA1, TA2) may be distinct according to whether the transmission of light is allowed. For example, the light emitting areas EA may be areas not allowing light to transmit (e.g., not allowing light to transmit to the back of the display panel), and the transmission areas (TA1, TA2) may be areas allowing light to transmit (e.g., allowing light to transmit to the back of the display panel).

The light emitting areas EA and the transmission areas (TA1, TA2) may be also distinct according to whether or not a specific metal layer is included. For example, the cathode electrode CE as shown in FIG. 3 may be disposed in the light emitting areas EA, and the cathode electrode CE may not be disposed in the transmission areas (TA1, TA2). In some embodiments, a light shield layer may be disposed in the light emitting areas EA, and a light shield layer may not be disposed in the transmission areas (TA1, TA2).

Since the first optical area OA1 includes the first transmission areas TA1 and the second optical area OA2 includes the second transmission areas TA2, both of the first optical area OA1 and the second optical area OA2 are areas through which light can pass.

In one embodiment, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 may be different from each other.

For example, in the example where the first optical electronic device 11, as shown in FIGS. 1A, 1B and 1C, overlapping the first optical area OA1 is a camera, and the second optical electronic device 12, as shown in FIGS. 1B and 1C, overlapping the first optical area OA1 is a camera, overlapping the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 may be greater than a ratio of the second transmission area TA2 to the second optical area OA2.

For convenience of description, the discussion that follows is provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HA1, and another horizontal display area in which the first optical area OA1 and the second optical area OA2 are not disposed is referred to as a second horizontal display area HA2.

Referring to FIG. 4, the first horizontal display area HA1 may include a portion of the normal area NA, the first optical area OA1, and the second optical area OA2. The second horizontal display area HA2 may include only another portion of the normal area NA.

FIG. 5A illustrates example arrangements of signal lines in each of the first optical area OA1 and the normal area NA of the display panel 110 according to aspects of the present disclosure, and FIG. 5B illustrates example arrangements of signal lines in each of the second optical area OA2 and the normal area NA of the display panel 110 according to aspects of the present disclosure.

First horizontal display areas HA1 shown in FIGS. 5A and 5B are portions of the first horizontal display area HA1 of the display panel 110. Second horizontal display area HA2 shown in FIGS. 5A and 5B are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 may include a portion of the normal area NA, the first optical area OA1, and the second optical area OA2. The second horizontal display area HA2 may include another portion of the normal area NA.

Various types of horizontal lines HL1 and HL2 and various types of vertical lines VLn, VL1, and VL2 may be disposed in the display panel 110.

In some embodiments, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL extends and, and the vertical direction may refer to, for example, a direction in which one data line DL extends. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more pixels SP.

Referring to FIGS. 5A and 5B, the vertical lines disposed in the display panel 110 may include vertical lines VLn disposed only in the normal area NA, first vertical lines VL1 running through both of the first optical area OA1 and the normal area NA, and second vertical lines VL2 running through both of the second optical area OA2 and the normal area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some embodiments, it should be noted that the term "horizontal" in the second horizontal line HL2 may mean that a signal is carried from a left side, to a right side, of the display panel (or from the right side to the left side), and may not mean that the second horizontal line HL2 runs in a straight line in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the typical vertical line VLn may mean that a signal is carried from an upper portion, to a lower portion, of the display panel (or from the lower portion to the upper portion), and may not mean that the typical vertical line VLn runs in a straight line in the direct vertical direction. For example, in FIGS. 5A and 5B, although the typical vertical lines VLn are illustrated in a straight line, one or more of the typical vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

Referring to FIG. 5A, the first optical area OA1 included in the first horizontal display area HA1 may include light emitting areas EA, as shown in FIG. 4, and first transmission areas TA1. In the first optical area OA1, respective outer areas of the first transmission areas TA1 may include corresponding light emitting areas EA.

Referring to FIG. 5A, in order to improve the transmittance of the first optical area OA1, the first horizontal lines HL1 may run through the first optical area OA1 while avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal display area HA1 and the second horizontal lines HL2 disposed in the second horizontal display area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 while avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TA1.

Thus, the first vertical lines VL1 running through the first optical area OA1 and the typical vertical lines VLn disposed in the normal area NA without running through the first optical area OA1 may have different shapes or lengths.

Referring to FIG. 5A, the first transmission areas TA1 included in the first optical area OA1 in the first horizontal display area HA1 may be arranged in a diagonal direction.

Referring to FIG. 5A, in the first optical area OA1 in the first horizontal display area HAL one or more light emitting areas EA may be disposed between two horizontally adjacent first transmission areas TA1. In the first optical area OA1 in the first horizontal display area HAL one or more light emitting areas EA may be disposed between two vertically adjacent first transmission areas TA1.

Referring to FIG. 5A, each of the first horizontal lines HL1 disposed in the first horizontal display area HA1 (e.g., each of the first horizontal lines HL1 running through the first optical area OA1) may include one or more curved or bent portions running around one or more respective outer edges of one or more of the first transmission areas TA1.

Referring to FIG. 5B, the second optical area OA2 included in the first horizontal display area HA1 may include light emitting areas EA and second transmission areas TA2. In the second optical area OA2, respective outer areas of the second transmission areas TA2 may include corresponding light emitting areas EA.

In one embodiment, the light emitting areas EA and the second transmission areas TA2 in the second optical area OA2 may have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom or bottom to top direction). For example, one or more light emitting areas EA may be disposed between two rows of second transmission areas.

When in the first horizontal display area HAL running through the second optical area OA2 and the normal area NA adjacent to the second optical area OA2, in one embodiment, the first horizontal lines HL1 may have substantially the same arrangement as the first horizontal lines HL1 of FIG. 5A.

In another embodiment, as shown in FIG. 5B, when in the first horizontal display area HAL running through the second optical area OA2 and the normal area NA adjacent to the second optical area OA2, the first horizontal lines HL1 may have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal display area HAL the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 while avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the typical vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

Referring to FIGS. 5A and 5B, according to an example light transmitting structure, the first optical area OA1 that at least partially overlaps the first optical electronic device 11 includes the first transmission areas TA1, and the second optical area OA2 that at least partially overlaps with the second optical electronic device 12 includes the second transmission areas TA2. Therefore, the number of subpixels per unit area in each of the first optical area OA1 and the second optical area OA2 may be less than that of the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal line 1s HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be less than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of pixels connected to each, or one or more, of the first horizontal lines HL1 running through the first optical area OA1 and the second optical area OA2 is less than the number of pixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be much smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is much smaller than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 6:
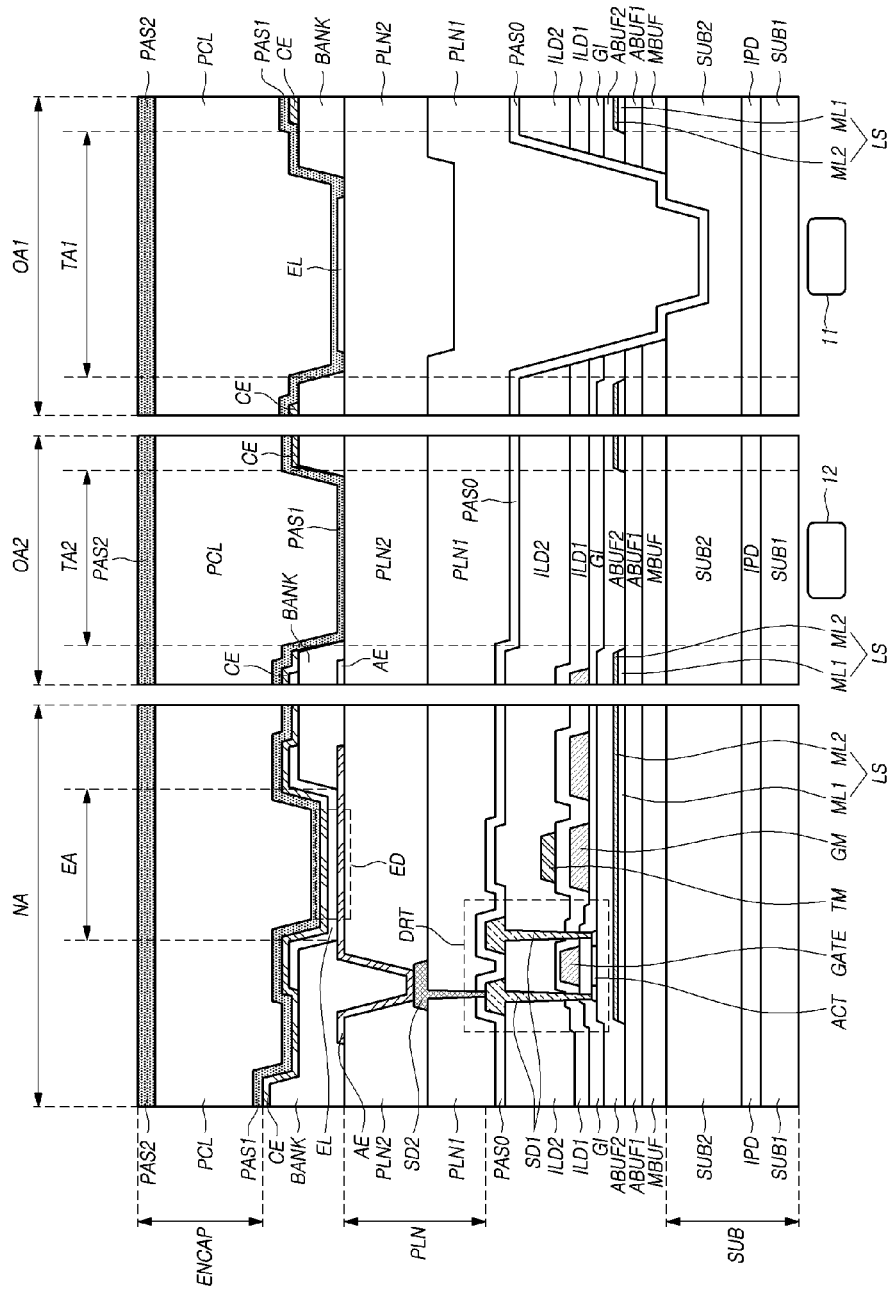
FIGS. 6 and 7 are example cross-sectional views of each of the first optical area, the second optical area, and the normal area included in the display area of the display panel according to embodiments of the present disclosure.
Figure 7:
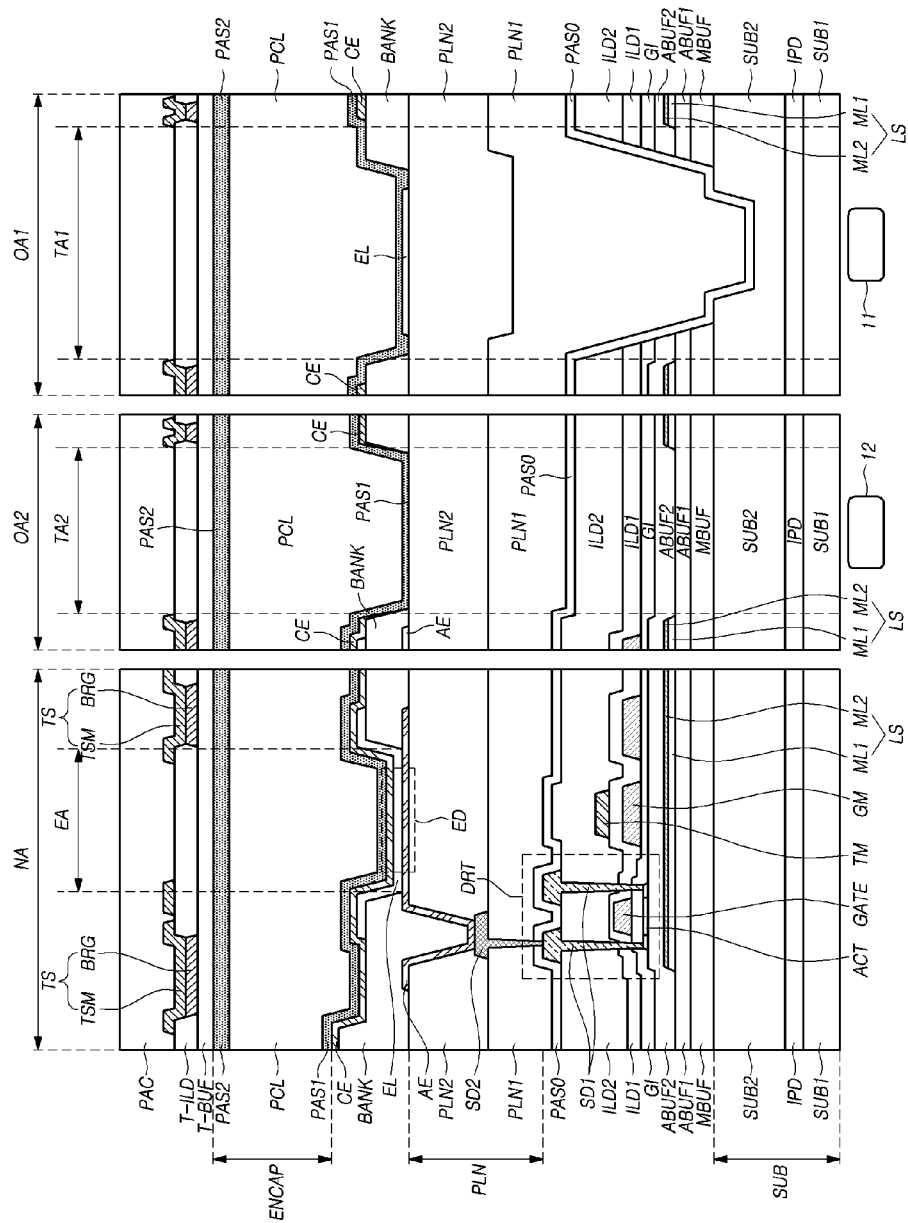

FIGS. 6 and 7 are example cross-sectional views of each of the first optical area OA1, the second optical area OA2, and the normal area NA included in the display area DA of the display panel 110 according to aspects of the present disclosure.

FIG. 6 shows the display panel 110 in an example where a touch sensor is implemented outside of the display panel 110 in the form of a touch panel, and FIG. 7 shows the display panel 110 in an example where a touch sensor TS is implemented inside of the display panel 110.

Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA of the first optical area OA1 and the second optical area OA2 may have the same stack structure as a light emitting area EA of the normal area NA.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or at least reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formatted. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the pixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According to an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the pixel SP may be opened.

A portion of the anode electrode AE may be exposed through the opening (the opened portion) of the bank BANK. An emission layer EL may be positioned on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic material layer.

An encapsulation layer ENCAP may be disposed on the stack of the light emitting element ED.

The encapsulation layer ENCAP may have a single-layer structure or a multi-layer structure for example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can reduce, minimize or prevent external moisture or oxygen from penetrating into the first encapsulation layer PAS1 and the second encapsulation layer PCL. For example, the third encapsulation layer PAS2 may include an inorganic insulating material, such as silicon nitride (SiNx), silicon oxide (SiOx), silicon oxynitride (SiON), aluminum oxide (Al2O3), or the like.

Referring to FIG. 7, in an example where a touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent or at least reduce damage to the emission layer EL, which is vulnerable to a chemical solution or moisture.

In order to prevent damage to the emission layer EL including an organic material, which is vulnerable to high temperatures, the touch buffer layer T-BUF can be formed at a low temperature less than or equal to a predetermined temperature (e.g., 100 degrees (° C.)) and be formed using an organic insulating material having a low permittivity of 1 to 3. For example, the touch buffer layer T-BUF may include an acrylic-based, epoxy-based, or silicon-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, the light emitting area EA of the first optical area OA1 may have the same stack structure as that in the normal area NA. Accordingly, in the discussion that follows, instead of repeatedly describing the light emitting area EA in the first optical area OA1, a stack structure of the first transmission area TA1 in the first optical area OA1 will be described in detail below.

In some embodiments, the cathode electrode CE may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Further, referring to FIGS. 6 and 7, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement.

Further, referring to FIG. 7, in some embodiments, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel 110 of the display device 100 according to aspects of the present disclosure, a transmittance improvement structure TIS can be provided to the first transmission area TA1 in the first optical area OA1.

Referring to FIGS. 6 and 7, the plurality of insulating layers included in the display panel 110 may include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

Referring to FIG. 7, the plurality of insulating layers included in the display panel 110 may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure (e.g., a recess, trench, concave, protrusion, etc.) in which the first planarization layer PLN1 and the passivation layer PAS0 have depressed portions that extend downward from respective surfaces thereof toward the substrate SUB as a transmittance improvement structure TIS.

Referring to FIGS. 6 and 7, among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof toward the substrate SUB. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (e.g., a recess, a trench, a concave portion, a protrusion, or the like) as a transmittance improvement structure TIS in a portion overlapping the first transmission area TA1. The protective layer PAC may be, for example, an organic insulating layer.

Referring to FIG. 7, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the pixel SP.

In order for the first optical area OA1 to have a transmittance greater than the normal area NA, an area or size of the touch sensor metal TSM per unit area in the first optical area OA1 may be smaller than an area or size of the touch sensor metal TSM per unit area in the normal area NA.

Referring to FIG. 7, in some embodiments, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE.

Further, the light shield layer LS including at least one of the first metal layer ML1 and the second metal layer ML2 may be disposed in the light emitting areas EA included in the non-optical area NA and the second optical area OA2, but may not be disposed in the second transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 may be different at least in part from as the stacked structure of the first transmission area TA1 in the first optical area OA1.

For example, as shown in FIGS. 6 and 7, in some embodiments, when the transmittance of the second optical area OA2 is less than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. Further, a width of the second transmission area TA2 in the second optical area OA2 may be less than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 in the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, in some embodiments, the anode electrode AE and the cathode electrode CE included in the light emitting element ED may not be disposed in the second transmission area TA2. In some embodiments, the emission layer EL of the light emitting element ED may or may not be disposed on the second transmission area TA2 according to a design requirement.

Further, referring to FIG. 7, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
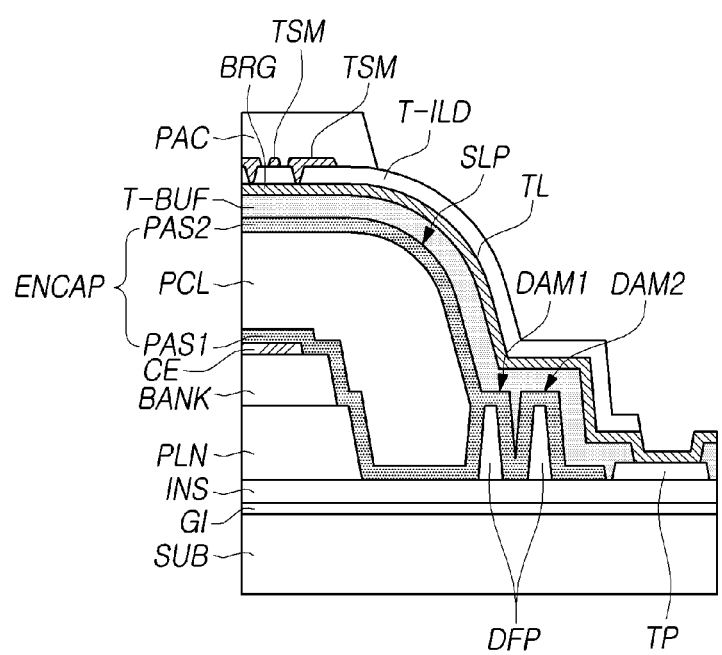
FIG. 8 is an example cross-sectional view of an edge of the display panel according to embodiments of the present disclosure.

FIG. 8 is an example cross-sectional view of an outer edge of the display panel 110 according to embodiments of the present disclosure.

For the sake of brevity, in FIG. 8, a single substrate SUB including the first substrate SUB1 and the second substrate SUB2 is illustrated, and layers or portions located under the bank BANK are illustrated in a simplified manner. In the same manner, FIG. 8 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1.

The third encapsulation layer PAS2 can reduce, minimize or prevent external moisture or oxygen from penetrating into the first encapsulation layer PAS1 and the second encapsulation layer PCL.

Referring to FIG. 8, in order to prevent or at least reduce the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1, DAM2) may be present at, or near to, a boundary point between the display area DA and the non-display area NDA.

The one or more dams (DAM1, DAM2) may include the same material DFP as the bank BANK.

Referring to FIG. 8, in one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1, DAM2). In another embodiment, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit 260, as shown in FIG. 2, is electrically connected, may be disposed on a portion of the substrate SUB outside of the one or more dams (DAM1, DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the dams (DAM1, DAM2), and extend up to the touch pad TP disposed outside of the dams (DAM1, DAM2).

Referring to FIG. 8, in one embodiment, the touch line TL may be the bridge metal BRG. In another embodiment, the touch line TL may be the touch sensor metal TSM.

Figure 9:
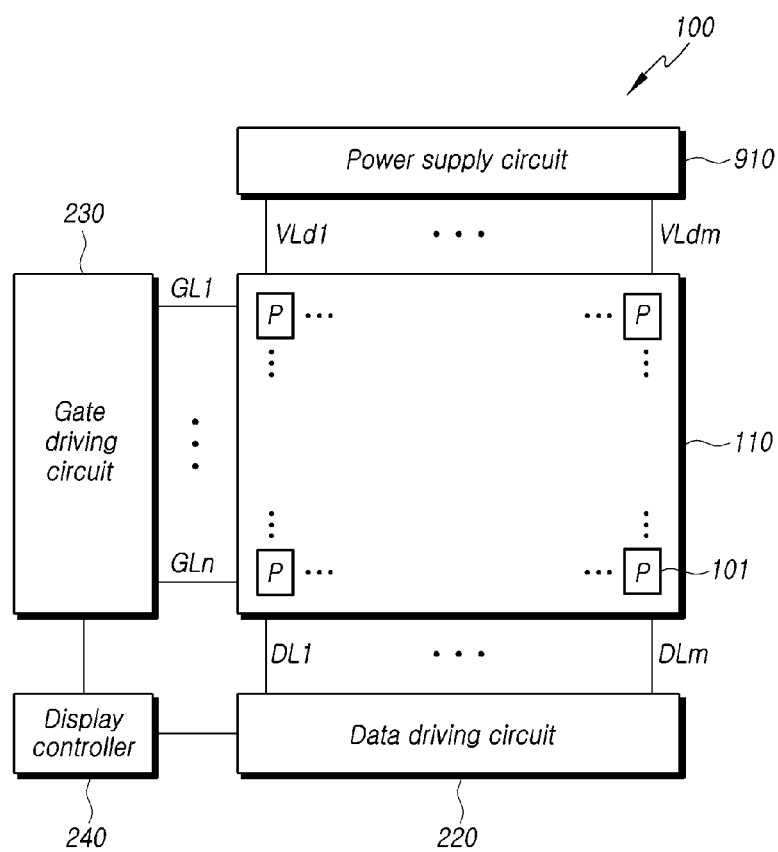
FIG. 9 illustrates another example system configuration of the display device according to embodiments of the present disclosure.

FIG. 9 illustrates another example system configuration of the display device according to aspects of the present disclosure.

Referring to FIG. 9, the display device 100 may include a display panel 110, a data driving circuit 220, a gate driving circuit 230, and a power supply circuit 910.

The display panel 110 may include a plurality of data lines DL1 to DLm, a plurality of gate lines GL1 to GLn, a plurality of first initialization voltage lines VL11 to VL1$n$, and a plurality of power lines VL21 to VL2$n$, and a plurality of pixels 101 that are connected to the plurality of data lines DL1 to DLm, the plurality of gate lines GL1 to GLn, the plurality of first initialization voltage lines VL11 to VL1$n$, and the plurality of power lines VL21 to VL2$n$ lines, and emit light.

At least one of the plurality of pixels 101 may include a driving transistor configured to generate a driving current in response to a voltage corresponding to a data signal, and a light emitting element capable of emitting light by receiving the driving current.

The data driving circuit 220 may be connected to the plurality of data lines DL1 to DLm and can supply data signals to the plurality of data lines DL1 to DLm. The data driving circuit 220 may be implemented in an integrated circuit. The data driving circuit 220 can be supplied with an image signal, which is a digital signal, and generate and supply a data signal, which is an analog signal.

The gate driving circuit 230 may be connected to the plurality of gate lines GL1 to GLn and can supply gate signals to the plurality of gate lines GL1 to GLn. Although the gate driving circuit 230 is illustrated as being located outside of the display panel 110, in some instances, the gate driving circuit 230 may be disposed in the display panel 110. In an embodiment, the gate driving circuit 230 can sequentially output a first initialization voltage so that the first initialization voltage can be supplied to the pixels. The first initialization voltage may have a first voltage level or a second voltage level.

The power supply circuit 910 can supply a first pixel driving voltage and a second pixel driving voltage. A voltage level of the second pixel driving voltage may be less than a voltage level of the first pixel driving voltage. The voltage level of the second pixel driving voltage may be a base voltage (e.g., a low voltage or a ground voltage). The voltage level of the first pixel driving voltage may be less than the first voltage level of the first initialization voltage.

The power supply circuit 910 can supply a first pixel driving voltage and a second pixel driving voltage. The power supply circuit 910 can supply the first pixel driving voltage to a plurality of pixel driving power lines VLd1 to VLdm, and commonly supply the second pixel driving voltage to the pixels. A voltage level of the first pixel driving voltage may be lower than the first voltage level of the first initialization voltage, and the second pixel driving voltage may be the base voltage.

In an embodiment, the power supply circuit 910 can supply a body voltage to a plurality of pixels 101. As the body voltage, a first body voltage and a second body voltage may be supplied, and one or more of the plurality of pixels 101 may be selectively supplied with the first body voltage and the second body voltage. A voltage level of the first body voltage may be equal to the first pixel driving voltage, and a voltage level of the second body voltage may be lower than the voltage level of the first body voltage.

In an embodiment, the power supply circuit 910 can supply a second initialization voltage to the pixels 101 It should be noted that voltages supplied from the power supply circuit 910 according to embodiments of the present disclosure are not limited thereto.

In some embodiments, the display device 100 may include a display controller 240 capable of controlling the data driving circuit 220, the gate driving circuit 230, and the power supply circuit 910. The display controller 240 can output an image signal, a clock signal, and a synchronization signal.

In an embodiment, a touch sensor for sensing a touch may be disposed to overlap the display panel 110 of the display device 100.

Figure 10:
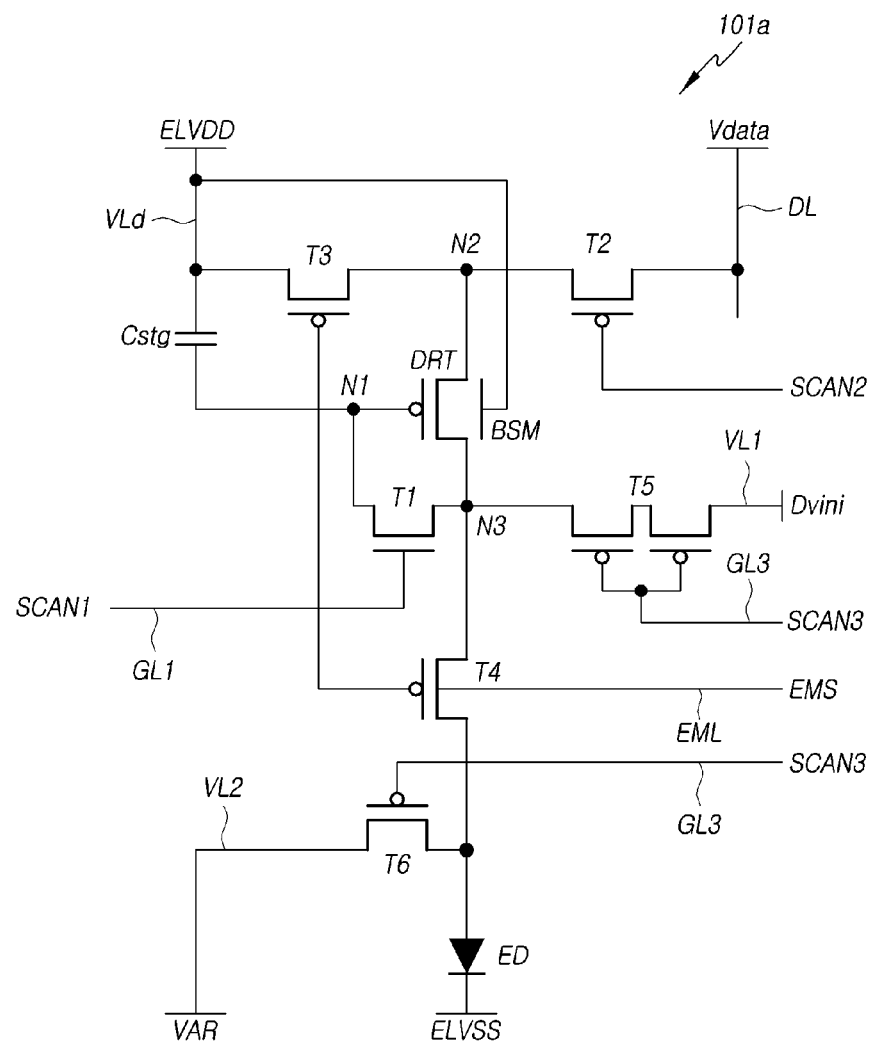
FIGS. 10 and 11 illustrate example circuit diagrams of pixels employed in the display device illustrated in FIG. 9 according to embodiments of the present disclosure.
Figure 11:
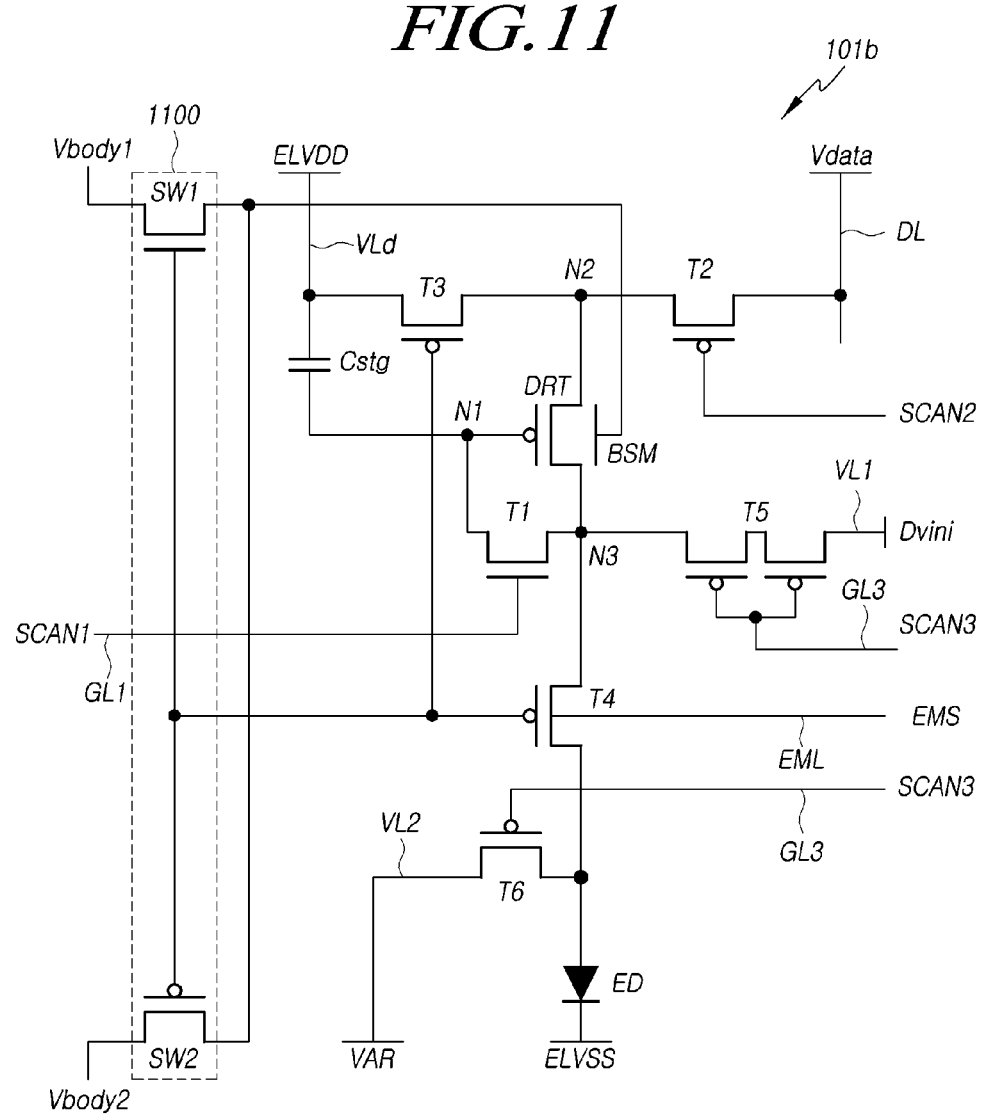

FIGS. 10 and 11 illustrate example circuit diagrams of pixels employed in the display device illustrated in FIG. 9.

Referring to FIGS. 10 and 11, each of pixels 101a and 101b may include a driving transistor DRT configured to generate a driving current flowing from a second node N2 to a third node N3 by a voltage at a first node N1 to which a voltage corresponding to a data signal is applied, and a light emitting element ED capable of emitting light by the driving current supplied from the driving transistor DRT, and a conductive layer BSM spaced apart from an active layer of the driving transistor DRT.

In an embodiment, each of the pixels 101a and 101b can be supplied with a body voltage by the power supply circuit 910. The body voltage may be applied to the conductive layer BSM. The threshold voltage of the driving transistor DRT may vary according to a magnitude of the body voltage applied to the conductive layer BSM.

A first electrode and a second electrode of the driving transistor DRT may be connected to the second node N2 and the third node N3, respectively. Further, a gate electrode of the driving transistor DRT may be connected to the first node NE A voltage corresponding to a data signal may be applied to the first node NE In a situation where a pixel driving voltage ELVDD is applied to the second node N2, the driving transistor DRT can enable a current to flow from the second node N2 to the third node N3 according to a level of a voltage applied to the first node N1.

The light emitting element ED may include an anode electrode, a cathode electrode, and an emission layer disposed between the anode electrode and the cathode electrode. A base voltage ELVSS may be applied to the cathode electrode of the light emitting element ED. The base voltage applied to the cathode electrode of the light emitting element ED may be a ground or negative voltage, and as a voltage having a high level is applied to the anode electrode of the light emitting element ED, a current can flow from the anode electrode to the cathode electrode of the light emitting element ED. Accordingly, the light emitting element ED can emit light.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

In some embodiments, each of the pixels 101a and 101b may include: a first transistor T1 connected between the first node N1 and the third node N3 and turned on by a first gate signal SCAN1; a second transistor T2 connected between one data line DL of a plurality of data lines and the second node N2 and turned on by a second gate signal SCAN2; a third transistor T3 connected between the pixel driving power line VLd connected to the pixel driving power supply supplying the pixel driving voltage ELVDD and the second node N2 and turned on by an emission signal EMS; a fourth transistor T4 connected between the third node N3 and the anode electrode of the light emitting element ED and turned on by the emission signal EMS; a fifth transistor T5 disposed between the first initialization voltage line VL1 for transmitting a first initialization voltage Dvini and the third node N3 and turned on by a third gate signal SCANS; and a storage capacitor Cstg connected between the first node N1 and the pixel driving power line VLd.

In some embodiments, each of the pixel 101a, 101b may include a sixth transistor T6 disposed between the anode electrode of the light emitting element ED and a second initialization power line VL2 for applying a second initialization voltage VAR to the anode electrode of the light emitting element ED, and turned on by the third gate signal SCANS.

The gate electrode of the first transistor T1 may be connected to a first gate line GL1, and thereby, the first transistor T1 can be turned on/off by the first gate signal SCAN1 carried through the first gate line GL1. When the first transistor T1 is turned on, the first node N1 and the third node N3 can be conductively connected, and thereby, the driving transistor DRT may enter a diode-connected state.

The gate electrode of the second transistor T2 may be connected to a second gate line GL2, and thereby, the second transistor T2 can be turned on/off by the second gate signal SCAN2 carried through the second gate line GL2. When the second transistor T2 is turned on, a voltage corresponding to a data signal Vdata carried through the data line DL can be applied to the second node N2.

The gate electrode of the third transistor T3 may be connected to an emission line EML, and thereby, the third transistor T3 can be turned on/off by the emission signal EMS carried through the emission line EML. When the third transistor T3 is turned on by the emission signal EMS, the pixel driving power line VLd supplying the pixel driving voltage ELVDD and the second node N2 can be connected, and thereby, the pixel driving voltage ELVDD can be applied to the second node N2.

The gate electrode of the fourth transistor T4 may be connected to the emission line EML, and thereby, the fourth transistor T3 can be turned on/off by to the emission signal EMS carried through the emission line EML. When the fourth transistor T4 is turned on by the emission signal EMS, the third node N3 and the anode electrode of the light emitting element ED can be connected, and thereby, a driving current flowing through the third node N3 can be applied to the light emitting element ED.

The gate electrode of the fifth transistor T5 may be connected to a third gate line GL3, and thereby, the fifth transistor T5 can be turned on/off by the third gate signal SCAN3 carried through the third gate line GL3. When the fifth transistor T5 is turned on by the third gate signal SCAN3, the first initialization voltage Dvini supplied through the first initialization signal line VL1 can be applied to the third node N3. In a situation where a voltage level of the first initialization voltage Dvini is greater than that of the pixel driving voltage ELVDD, the first initialization voltage Dvini can be applied to the second node N2 through the driving transistor DRT. Accordingly, the second node N2 and the third node N3 can be initialized by the first initialization voltage Dvini.

In an embodiment, third transistor T5 may have a double gate electrode. Due to the double gate structure, the amount of leakage current flowing through the fifth transistor T5 may be reduced.

The gate electrode of the sixth transistor T6 may be connected to the third gate line GL3, and thereby, the sixth transistor T6 can be turned on/off by the third gate signal SCAN3 carried through the third gate line GL3. When the sixth transistor T3 is turned on by the third gate signal SCANS, the second initialization voltage VAR supplied through the second initialization signal line VL2 can be applied to the anode electrode of the light emitting element ED, and thereby, the voltage of the anode electrode can be initialized by the second initialization voltage VAR.

In some embodiments, the first transistor T1 may be a transistor using oxide semiconductor as an N-type MOS transistor, and the driving transistor DRT and the second to sixth transistors T2 to T6 may be low-temperature polysilicon transistors as P-type MOS transistors. However, embodiments of the present disclosure are not limited to these types of transistors.

The transistor using the oxide semiconductor can reduce an amount of leakage current compared to the low-temperature polysilicon transistor. In contrast, the low-temperature polysilicon transistor can have an advantage of higher carrier mobility than the transistor using the oxide semiconductor.

If the voltage of the first node N1 is reduced due to a leakage current, since the image quality of the display device may be deteriorated, the first transistor T1 may be therefore a transistor using the oxide semiconductor, and the driving transistor DRT and the second to sixth transistors T2 to T6 may be low-temperature polysilicon transistors. Further, in the example where a pixel includes a transistor using the oxide semiconductor, an amount of leakage current can be reduced, this enabling the display device 100 to be implemented in a larger size.

A first electrode and a second electrode of the storage capacitor Cstg may be connected to the pixel driving power line VLd connected to the pixel driving power supply supplying the first pixel driving voltage ELVDD and the first node N1, respectively. The storage capacitor Cstg enables a voltage at the first node N1 to be maintained at a predetermined level.

The first gate line GL1, the second gate line GL2, the third gate line GL3, and the emission line EML may correspond to the horizontal lines HL1 and HL2 illustrated in FIGS. 5A and 5B. However, embodiments of the present disclosure are not limited thereto.

As shown in FIG. 10, the conductive layer BSM of the pixel 101a may be connected to the pixel driving power line VLd supplying the first pixel driving voltage ELVDD. The conductive layer BSM may be supplied with the first pixel driving voltage ELVDD as a body voltage.

As shown in FIG. 11, the conductive layer BSM of the pixel 101b may be connected to a switch circuit 1100. The switch circuit 1100 may include a first switch SW1 and a second switch SW2. The first switch SW1 may be disposed between a first body power supply supplying a first body voltage Vbody1 and the conductive layer BSM, and the second switch SW2 may be disposed between a second body power supply supplying a second body voltage Vbody2 and the conductive layer BSM.

The first body voltage Vbody1 may be a voltage having a level equal to the pixel driving voltage ELVDD, and the second body voltage Vbody2 may be a voltage less than the pixel driving voltage ELVDD.

The first switch SW1 and the second switch SW2 may be connected to the emission line EML, and can be turned on/off by the emission signal EMS carried through the emission line EML. When the first switch SW1 is turned on, the second switch SW2 can be turned off, and when the first switch SW1 is turned off, the second switch SW2 can be turned on. The first switch SW1 may include an N-type MOS transistor, and the second switch SW2 may include a P-type MOS transistor.

The first body voltage Vbody1 can be applied to the conductive layer BSM by the turn-on/turn-off operation of the first switch SW1, and the second body voltage Vbody2 can be applied to the conductive layer BSM by the turn-on/turn-off operation of the second switch SW2.

Due to the transmission areas TA1 and TA2, the number of pixels per unit area of each of the optical areas OA1 and OA2 illustrated in FIGS. 1A, IB, and 1C may be less than that of the normal area NA. The normal area NA may be referred to as a first pixel area, and the optical areas OA1 and OA2 may be referred to as second pixel areas.

The pixel 101a illustrated in FIG. 10 may be one of pixels 101a present in the first pixel area of the display panel 110, and the pixel 101b illustrated in FIG. 11 may be one of pixels 101d present in the second pixel areas of the display panel 110.

Figure 12A:
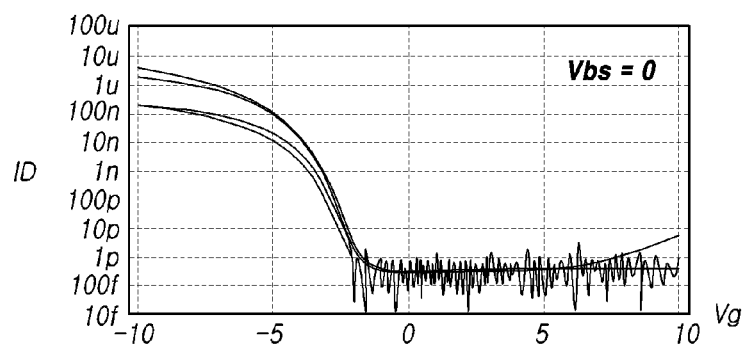
FIGS. 12A to 12C illustrate example characteristic curves of a driving transistor to which a body voltage is applied in the display device according to embodiments of the present disclosure.
Figure 12B:
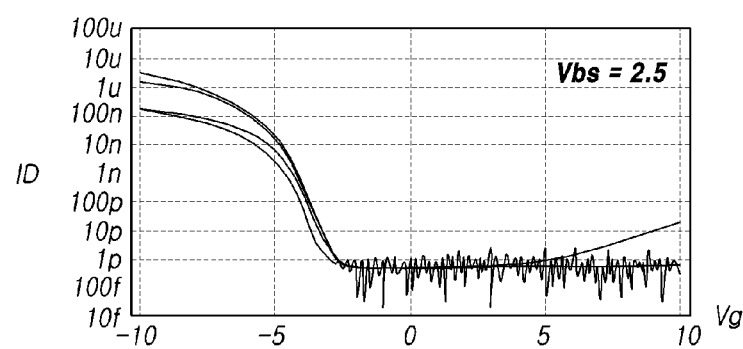
Figure 12C:
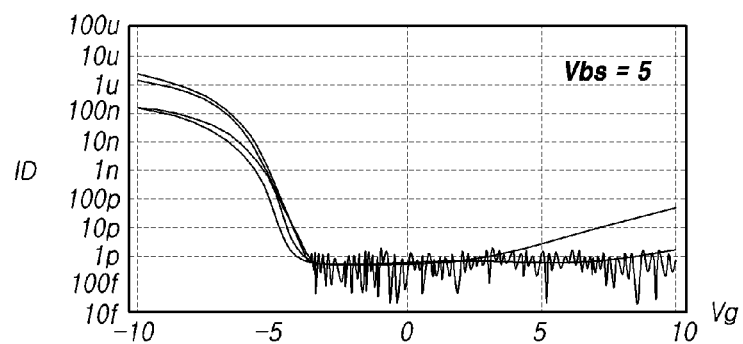

FIGS. 12A, 12B, and 12C illustrate example characteristic curves of a driving transistor to which a body voltage is applied in the display device according to embodiments of the present disclosure.

FIG. 12A shows an example where a difference between a body voltage and a voltage at the source electrode (e.g., the second node of FIG. 10 or FIG. 11) of a driving transistor (e.g., the driving transistor DRT of FIG. 10 or FIG. 11) equals to 0V. FIG. 12B shows an example where a difference between a body voltage and a voltage at the source electrode (e.g., the second node of FIG. 10 or FIG. 11) of the driving transistor DRT (e.g., the driving transistor DRT of FIG. 10 or FIG. 11) equals to 2.5V. FIG. 12C shows an example where a difference between a body voltage and a voltage at the source electrode (e.g., the second node of FIG. 10 or FIG. 11) of the driving transistor DRT (e.g., the driving transistor DRT of FIG. 10 or FIG. 11) equals to 5V.

Referring to FIGS. 12A, 12B, and 12C, it can be seen that amounts of driving currents ID generated according to gate voltages Vg applied to the gate electrode of the driving transistor DRT are changed depending on body voltages. FIG. 12A shows that when the gate voltage Vg is greater than −2V (e.g., −2.5V, −5V), a driving current flows through the driving transistor DRT. FIG. 12B shows that when the gate voltage Vg is greater than −2.5V (e.g., −3V, −5V), a driving current flows through the driving transistor DRT. FIG. 12c shows that when the gate voltage Vg is greater than −4V (e.g., −4.5V, −5V), a driving current flows through the driving transistor DRT. Here, 0V may be the lowest voltage, and both −1V and 1V may be voltages higher than 0V.

It can be seen that a magnitude of the gate voltage Vg at which a driving current ID starts to flow is the lowest in FIG. 12A and the highest in FIG. 12C. This means that the threshold voltage of the driving transistor DRT is the lowest in FIG. 12A and the highest in FIG. 12C. That is, it can be seen that the threshold voltage of the driving transistor DRT decreases as the body voltage decreases.

Figure 13:
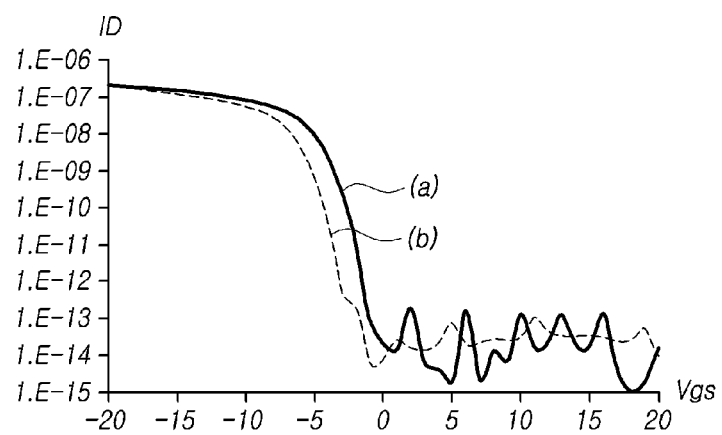
FIG. 13 is an example graph showing magnitudes of driving currents according to magnitudes of body voltages applied to a driving transistor in the display device according to embodiments of the present disclosure.

FIG. 13 is an example graph showing a magnitude of a driving current generated according to a magnitude of a body voltage applied to a driving transistor DRT in the display device 100 according to aspects of the present disclosure.

FIG. 13 shows that a magnitude of the driving current varies according to a voltage difference between a body voltage and a voltage at the source electrode (e.g., the second node of FIG. 10 or FIG. 11) of the driving transistor DRT (e.g., the driving transistor DRT of FIG. 10 or FIG. 11). In FIG. 13, curve (a) shows an example where the body voltage is lower than the pixel driving voltage ELVDD, and curve (b) shows an example where the body voltage is equal to the pixel driving voltage ELVDD.

That is, it can be seen that even when a voltage between the gate electrode and the source electrode of the driving transistor DRT is constant, when the body voltage increases, a magnitude of the driving current decreases, and when the body voltage decreases, a magnitude of the driving current increases.

The number of pixels per unit area of each of the optical areas OA1 and OA2 illustrated in FIGS. 1A, IB, and 1C may be less than that of the normal area NA. An area of the display area in which the number of pixels per unit area is smaller may have lower luminance than another area of the display area in which the number of pixels per unit area is larger. In order to solve the problem that the luminance of the optical areas OA1 and OA2 decreases, compensation for the luminance of the optical areas OA1 and OA2 can be realized by configuring the luminance of the pixels disposed in the optical areas OA1 and OA2 to be increased.

To compensating for the luminance, the power supply circuit 910 can supply a first body voltage (e.g., the first body voltage Vbody1) or a second body voltage (e.g., the second body voltage Vbody2) having a voltage level lower than that of the first body voltage, and supply the second body voltage to pixels disposed in the optical areas OA1 and OA2.

Figure 14:
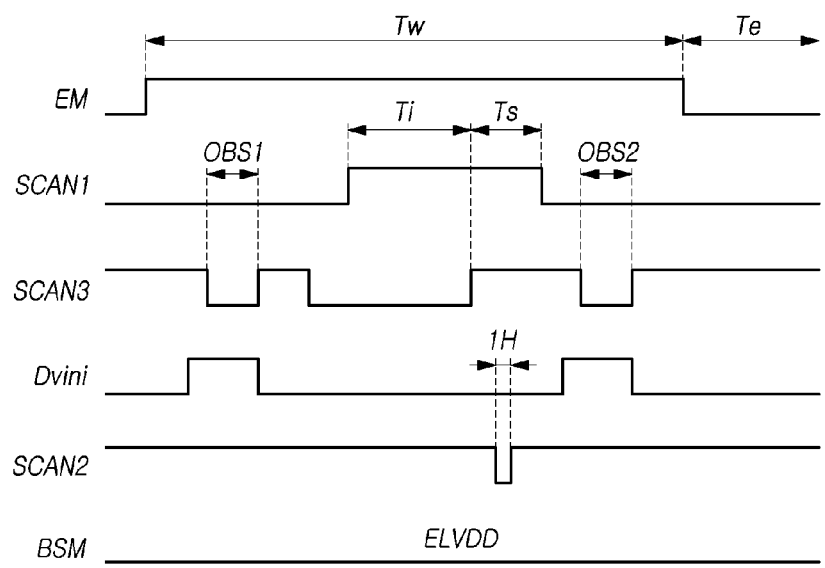
FIG. 14 is an example timing diagram illustrating the operation of the pixel illustrated in FIG. 10 in the display device according to embodiments of the present disclosure.
Figure 15:
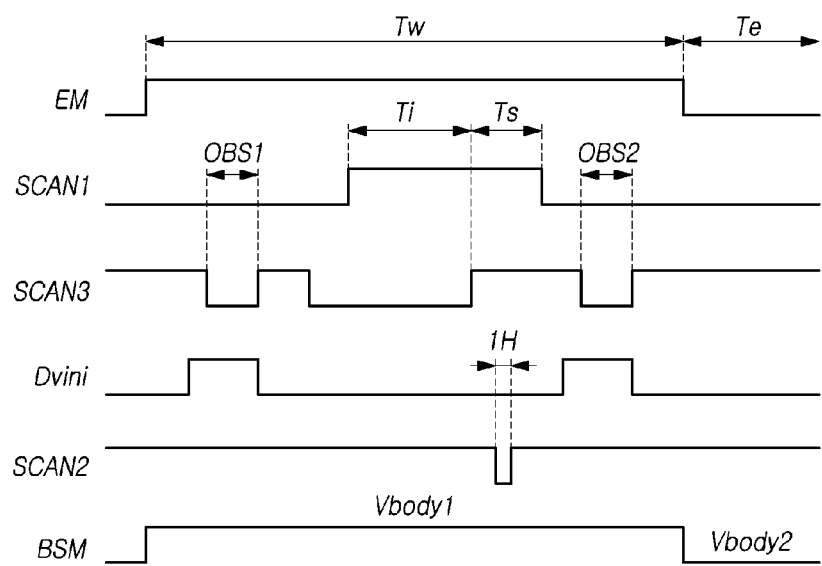
FIG. 15 is an example timing diagram illustrating the operation of the pixel illustrated in FIG. 11 in the display device according to embodiments of the present disclosure.

FIG. 14 is an example timing diagram illustrating the operation of the pixel illustrated in FIG. 10 in the display device 100 according to aspects of the present disclosure. FIG. 15 is an example timing diagram illustrating the operation of the pixel illustrated in FIG. 11 in the display device 100 according to aspects of the present disclosure.

Referring to FIGS. 14 and 15, a period for driving the pixels 101a and 101b may be divided into a data writing period Tw and an emission period Te, and the pixels 101a and 101b can operate in the data writing period Tw and the emission period Te. The data writing period Tw refers to a period in which a data signal Vdata is applied or written to the gate electrode of the driving transistor DRT shown in FIG. 10 or 11, and the emission period Te refers to a period in which the driving transistor DRT supplies a driving current to the light emitting element ED by the data signal Vdata applied to the gate electrode of the driving transistor DRT.

In an embodiment, the threshold voltage of the driving transistor DRT can be sensed in the data writing period Tw. The data writing period Tw may include, for example, a first on-bias stress period OBS1, an initialization period Ti, a sensing period Ts, and a second on-bias stress period OBS2.

The first on-bias stress period OBS1 and the second on-bias stress period OBS2 may be periods in which a voltage having a high level is applied to the driving transistor DRT. Even when the voltage applied to the driving transistor DRT varies, a hysteresis problem may occur in that driving current does not flow with an amount varied according to a magnitude of the varied voltage. However, the hysteresis of the driving transistor DRT can be reduced or removed by applying a voltage having a high level to the driving transistor DRT.

During the data writing period Tw, a driving current does not flow to the light emitting element ED. In a situation where the third transistor T3 and the fourth transistor T4 are off, the pixel driving power line VLd connected to the pixel driving power supply and the second node N2 can be electrically disconnected, and the third node N3 and the light emitting element ED can be electrically disconnected. Accordingly, no current flows from the driving transistor DRT to the light emitting element ED. When a signal having a high level is transmitted to the emission line EML, since the third transistor T3 and the fourth transistor T4 connected to the emission line EML, which are P-type MOS transistors, are off therefore, in the data writing period Tw, an emission signal EMS flowing through the emission line EML can be supplied with the high level.

Further, in the first on-bias stress period OBS1, the first gate signal SCAN1 and the third gate signal SCANS may have a low level, and the second gate signal SCAN2 may have a high level. When the first gate signal SCAN1 has the low level, the first transistor T1 is off because the first transistor T1 is an N-type MOS transistor. Since the second gate signal SCAN2 has the high level, the second transistor T2 can be off, and therefore, a data signal Vdata transmitted through the data line DL cannot be supplied to the second node N2.

Since the third gate signal SCAN3 has the low level, the fifth transistor T5 can be turned on, and therefore, the first initialization voltage Dvini can be transmitted to the second node NS via the third node N3.

Since the first initialization voltage Dvini has a voltage level higher than the driving voltage, hysteresis of the driving transistor DRT can be improved.

In the initialization period Ti, the first gate signal SCAN1 may have a high level, the second gate signal SCAN2 may have the high level, and the third gate signal SCAN3 may have the low level. When the first gate signal SCAN1 has the high level, the first transistor T1 can be turned on. When the first transistor T1 is turned on, the first node N1 and the third node N3 can be connected, this enabling the first transistor T1 to become diode-connected.

Since the second gate signal SCAN2 has the high level, the second node N2 and the data line DL cannot be electrically connected. Since the third gate signal SCAN3 has the low level, the fifth transistor T5 can be on, and therefore, the first initialization voltage Dvini can be applied to the third node N3. The first initialization voltage Dvini applied to the third node N3 may have a low level, and the third node N3 may be initialized by the first initialization voltage Dvini having the low level.

In the sensing period Ts, the first gate signal SCAN1 may have the high level, and the third gate signal SCAN3 may have a high level, and while the first gate signal SCAN1 and the third gate signal SCAN3 remain at the high level, the second gate signal SCAN2 may have a low level during 1H period (one horizontal period). Since the first gate signal SCAN1 and the third gate signal SCAN3 are at the high level, the first transistor T1 can be on, and the fifth transistor T5 can be turned off.

When the second gate signal SCAN2 has the low level, the second transistor T2 is turned on, and a data signal Vdata flowing through the data line DL can be transmitted to the second node N2. At this time, since the first transistor T1 remains on, a current can flow from the second node N2 to the third node N3 by the data signal Vdata applied to the second node N2, and a voltage corresponding to the current flowing from the second node N2 to the third node N3 may be applied or written to the first node N1. The voltage applied or written to the second node N2 may be a voltage corresponding to the data signal Vdata and the threshold voltage of the driving transistor DRT.

In the second on-bias stress period OBS2, the first gate signal SCAN1 and the third gate signal SCAN3 may have the low level, and the second gate signal SCAN2 may have the high level. The first transistor T1 can be off by the first gate signal SCAN1, and the second transistor T2 can be off by the second gate signal SCAN2. The fifth transistor T5 can be turned on by the third gate signal SCAN3.

While the first gate signal SCAN1 has the low level, the first transistor T1 is off. Since the second gate signal SCAN2 has the high level, the second transistor T2 can be off, and therefore, a data signal Vdata transmitted through the data line DL cannot be supplied to the second node N2. Since the fifth transistor T5 is on, the first initialization voltage Dvini can be transmitted to the third node N3. Since the first initialization voltage Dvini transmitted to the third node N3 is higher than the pixel driving voltage ELVDD, the first initialization voltage Dvini transmitted to the third node N3 can be transmitted to the second node N2. Accordingly, the hysteresis of the first transistor T1 can be reduced or removed as the first initialization voltage Dvini is applied to the second node N2 and the third node N3.

In particular, when the display device 100 is driven at a relatively low frequency, a cycle in which a voltage applied to the driving transistor DRT varies is very long, and therefore, an effect of reducing or removing the hysteresis of the driving transistor DRT can become much bigger by the first initialization voltage Dvini applied during the first on-bias stress period OBS1 and the second on-bias stress period OBS2. Further, when the display device 100 is driven at the low frequency, power consumption of the display device 100 can be reduced.

Since the sixth transistor T6 is turned on/off in response to the third gate signal SCANS, the second initialization voltage Var for initializing the anode electrode of the light emitting element ED can be supplied in the first OBS period OBS1 and the second OBS period OBS2 and thereby, the anode electrode of the light emitting element ED can be initialized by the second initialization voltage Var.

In an embodiment, in FIG. 14, a first body voltage (e.g., the first body voltage Vbody1) may be supplied to the pixel 101a in the data writing period Tw and the emission period Te. A voltage level of the first body voltage Vbody1 may be equal to that of the pixel driving voltage ELVDD, and the threshold voltage of the driving transistor DRT of the pixel 101a can be lowered by the first body voltage Vbody1.

In an embodiment, as shown in FIG. 15, the first body voltage Vbody1 may be supplied to the pixel 101b in the data writing period Tw, and a second body voltage (e.g., the second body voltage Vbody2) may be supplied to the pixel 101b in the emission period Te. As the first body voltage Vbody1 is supplied to the driving transistor DRT of the pixel 101b in the data writing period Tw, thereby, the threshold voltage of the driving transistor DRT can be lowered, and as the second body voltage Vbody2 having a lower level than the first body voltage Vbody1 is supplied to the driving transistor DRT of the pixel 101b in the emission period Te, even when a same data signal is applied to the pixels 101a and 101b, the luminance of the pixel 101b to which the first body voltage Vbody1 and the second body voltage Vbody2 are applied can be higher than that of the pixel 101a to which the first body voltage Vbody1 is applied.

As a result, the luminance of the pixels 101b disposed in the optical areas OA1 and OA2 having a small number of pixels per unit area may be relatively higher than that of the pixels 101a disposed in the normal area NA, and in turn, the luminance of the optical areas OA1 and OA2 can be compensated for.

Figure 16:
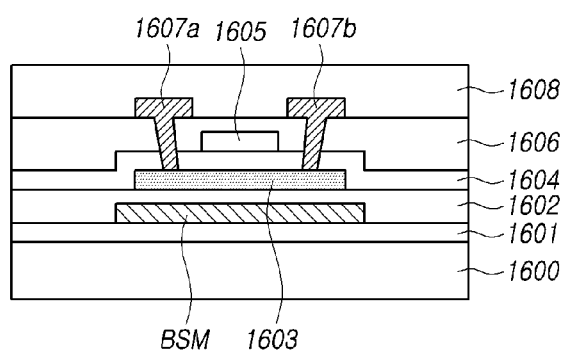
FIG. 16 is an example cross-sectional view illustrating that a driving transistor and a conductive layer are disposed in the display device according to embodiments of the present disclosure.

FIG. 16 is an example cross-sectional view illustrating that a driving transistor (e.g., the driving transistor DRT of the pixel 110a or 110b of FIG. 10 or 11) and a conductive layer (e.g., the conductive layer BSM of FIG. 10 or 11) are disposed in the display device 100 according to aspects of the present disclosure.

Referring to FIG. 16, a buffer layer 1601 may be formed on a substrate 1600, and the conductive layer BSM may be disposed on the buffer layer 1601. Further, an insulating layer 1602 may be disposed on the conductive layer BSM, and an active layer 1603 of the driving transistor DRT may be disposed on the insulating layer 1602 such that the active layer 1603 overlaps the conductive layer BSM. The conductive layer BSM can serve to prevent light traveling through the substrate from reaching the active layer 1603.

A gate insulating layer 1604 may be disposed on the insulating layer 1602 on which the active layer 1603 is disposed, and a gate electrode 1605 may be disposed on the gate insulating layer 1604 such that the gate electrode 1605 overlaps the active layer 1603. A first interlayer insulating layer 1606 may be disposed on the gate insulating layer 1604 on which the gate electrode 1605 is disposed, and a source electrode 1607a and a drain electrode 1607b, which are formed with a source drain metal, may be disposed on the first interlayer insulating layer 1606. The source electrode 1607a and the drain electrode 1607b may contact the active layer 1603 through respective contact holes. A second interlayer insulating layer 1608 may be disposed on the first interlayer insulating layer 1606 on which the source electrode 1607a and the drain electrode 1607b are disposed.

Figure 17:
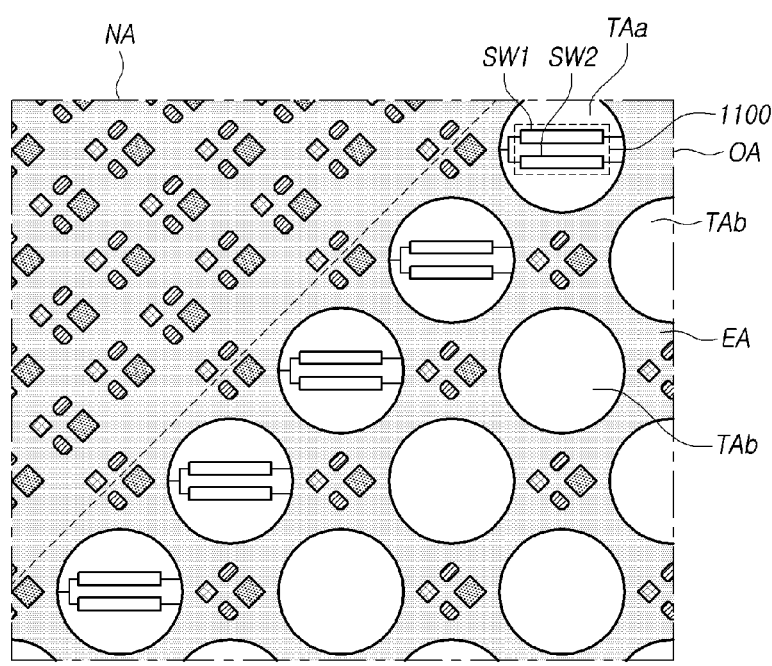
FIG. 17 is a plan view illustrating an example optical area in the display device according to embodiments of the present disclosure.

FIG. 17 is a plan view illustrating an example optical area in the display device 100 according to embodiments of the present disclosure.

Referring to FIG. 17, the optical area OA may include a plurality of transmission areas (TAa, TAb) and at least one light emitting area EA.

The optical area OA may be any one of the first optical area OA1 and the second optical area OA2 illustrated in FIGS. 1A, 1B, and 1C. Further, a normal area NA may be disposed around the optical area OA. In the example where the optical area OA includes the transmission areas (TAa and/or TAb), the optical area OA may include a fewer number of pixels than the normal area NA. The plurality of transmission areas (TAa and/or TAb) can serve to increase light transmittance in the optical area OA.

Each of the transmission areas (TAa and/or TAb) may have a shape such as a circular hole in the optical area OA. However, embodiments of the present disclosure are not limited thereto. The light emitting area EA may be an area disposed between the transmission areas (TAa and/or TAb). The pixel 101a illustrated in FIG. 10 may be disposed in the normal area NA, and the pixel 101b illustrated in FIG. 11 may be disposed in the light emitting area EA.

The second power supply circuit 1100 may be disposed in at least one outermost transmission area TAa disposed at an outer edge adjacent to the normal area among the plurality of transmission areas (TAa and/or TAb). Accordingly, the second power supply circuit 1100 may be disposed to overlap the display area DA of the display panel 110. The second power supply circuit 1100 may include a first switch (e.g., the first switch SW1 of FIG. 11) and a second switch (e.g., the second switch SW2 of FIG. 11). In an embodiment, the outermost transmission area TAa may be an area that does not overlap the first optical electronic device 11. In an embodiment, the outermost transmission area TAa may be an area that does not overlap the second optical electronic device 12.

In an embodiment, the second power supply circuit 1100 may not be disposed in the remaining transmission areas TAb (i.e., the transmission areas TAb disposed in the inner area of the optical area OA) except for the at least one outermost transmission area TAa among the plurality of transmission areas (TAa and/or TAb).

Figure 18:
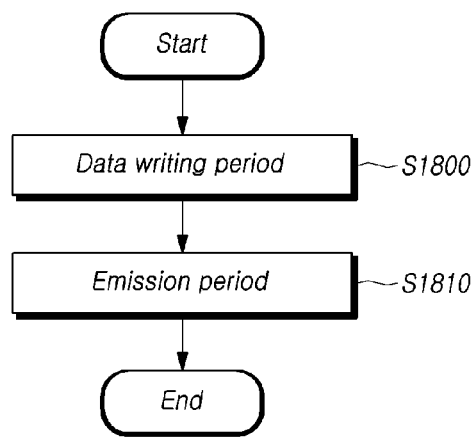
FIG. 18 is a flow diagram illustrating a method of driving the display device according to embodiments of the present disclosure.

FIG. 18 is a flow diagram illustrating a method of driving the display device 100 according to embodiments of the present disclosure.

Referring to FIG. 18, the display device 100 may include a plurality of pixels 101. The pixels 101 can operate in a data writing period Tw and an emission period Te. In the data writing period Tw, the threshold voltage of a respective driving transistor DRT (e.g., the driving transistor DRT shown in FIG. 10 or 11) included in each of the pixels (e.g., the pixels 101a and 101b shown in FIGS. 10 and 11) can be sensed, and a voltage obtained by compensating a data signal with the threshold voltage can be applied to the first node N1 of the driving transistor DRT. In the emission period Te, a driving current can be caused to flow from the second node N2 to the third node N3 by the voltage applied to the first node N1, and in turn, the light emitting element ED can emit light by the driving current.

The first body voltage Vbody1 may be supplied to the plurality of pixels (101a and/or 101b) in the data writing period Tw, at step S1800. The plurality of pixels may include one or more pixels 101a disposed in the normal area NA and one or more pixels 101b disposed in the optical area OA. The threshold voltage of the driving transistors DRT included in each of the plurality of pixels (101a and/or 101b) may be lowered by the first body voltage Vbody1. The first body voltage Vbody1 may have the same voltage level as the pixel driving voltage ELVDD supplied to the plurality of pixels (101a and/or 101b).

In the emission period Te, the plurality of pixels (101a and/or 101b) can emit light, at step S1810. In the emission period Te, the first body voltage Vbody1 may be supplied to one or more (e.g., one or more pixels 101a) of the plurality of pixels (101a and/or 101b), and the second body voltage Vbody2 may be supplied to one or more (e.g., one or more pixels 101b) of the plurality of pixels (101a and/or 101b). A voltage level of the second body voltage Vbody2 may be lower than a voltage level of the first body voltage Vbody1. The higher body voltage applied to the driving transistor DRT is, the larger driving current generated by the driving transistor DRT is. Accordingly, a larger driving current can flow into the pixel 101b receiving the second body voltage Vbody2, compared with the pixel 101a receiving the first body voltage Vbody1. Thus, the pixel 101b receiving the second body voltage Vbody2 may have higher luminance than the pixel 101a receiving the first body voltage Vbody1.

In the foregoing, the one or more (e.g., one or more pixels 101a) of the plurality of pixels (101a and/or 101b) may be one or more pixels disposed in the normal area NA, and the one or more (e.g., one or more pixels 101b) of the plurality of pixels (101a and/or 101b) may be one or more pixels disposed in the optical area OA. According to an example where one or more pixels 101a may be disposed in a first pixel area, and one or more pixels 101b may be disposed in a second pixel area in which the number of pixels per unit area is smaller than that of the first pixel area, the luminance of each pixel 101b disposed in the second pixel area can be increased, and as a result, the second pixel area cannot become darker than the first pixel area.

According to the one or more embodiments described herein, a display device (e.g., the display device 100 in FIG. 2 or 9) and a method of driving the display device can be provided for realizing a narrow bezel without the deterioration of quality of images displayed.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein may be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
   a display panel comprising a plurality of data lines, a plurality of gate lines, and a plurality of pixels connected to the plurality of data lines and the plurality of gate lines; and
   a power supply circuit configured to supply a first body voltage and a second body voltage having a voltage level that is less than the first body voltage,
   wherein one or more of the plurality of pixels are selectively supplied with the first body voltage and the second body voltage.

2. The display device according to claim 1, further comprising:
   a data driving circuit configured to supply data signals to the plurality of data lines; and
   a gate driving circuit configured to supply gate signals to the plurality of gate lines.

3. The display device according to claim 1, wherein one or more other pixels from the plurality of pixels, which are different from the one or more of the plurality of pixels being selectively supplied with the first body voltage and the second body voltage, are constantly supplied with the first body voltage.

4. The display device according to claim 1, wherein each of the plurality of pixels comprises:
   a driving transistor that comprises a gate electrode, and first and second electrodes connected to first, second, and third nodes, respectively, the driving transistor configured to generate a driving current flowing from the second node to the third node;

a light emitting element configured to emit light in accordance with the driving current from the driving transistor;

a storage capacitor configured to maintain a voltage at the gate electrode of the driving transistor; and a conductive layer spaced apart from an active layer of the driving transistor.

5. The display device according to claim 4, wherein each of the plurality of pixels further comprises:

a first transistor connected between the first node and the third node, the first transistor turned on by a first gate signal;

a second transistor connected between one of the plurality of data lines and the second node, the second transistor turned on by a second gate signal;

a third transistor connected between the second node and a pixel driving power line that transmits a same voltage as the first body voltage, the third transistor turned on by an emission signal;

a fourth transistor connected between the third node and an anode electrode of the light emitting element, the fourth transistor turned on by the emission signal; and a fifth transistor disposed between the third node and a first initialization voltage line that transmits a first initialization voltage, the fifth transistor turned on by a third gate signal.

6. The display device according to claim 5, wherein in response to the third gate signal, the fifth transistor is turned on before a data signal is applied to the first node and after the data signal is applied to the first node.

7. The display device according to claim 5, wherein each of the plurality of pixels further comprises a sixth transistor disposed between the anode electrode of the light emitting element and a second initialization power line for applying a second initialization voltage to the anode electrode of the light emitting element, the sixth transistor turned on by the third gate signal.

8. The display device according to claim 4, wherein the first body voltage and the second body voltage are supplied to one or more respective conductive layers of one or more of the plurality of pixels.

9. The display device according to claim 4, wherein the power supply circuit comprises:

a first switch disposed between the conductive layer and a first body power supply that supplies the first body voltage, the first switch configured to supply the first body voltage to the conductive layer in a data writing period in which a voltage corresponding to a data signal is written to the first node; and a second switch disposed between the conductive layer and a second body power supply that supplies a second body voltage, the second switch configured to supply the second body voltage to the conductive layer in an emission period in which the light emitting element emits light.

10. The display device according to claim 9, wherein the display panel comprises a display area comprising a first optical area and a normal area located outside of the first optical area, and a non-display area, and wherein the first optical area comprises a plurality of light emitting areas and a plurality of first transmission areas, and the normal area comprises a plurality of light emitting areas, the display device further comprising:

a first optical electronic device located under, or on a rear surface of, the display panel, the first optical electronic device overlapping at least a portion of the first optical area included in the display area.

11. The display device according to claim 10, wherein the one or more of the plurality of pixels which are selectively supplied with the first body voltage and the second body voltage, are disposed in the first optical area.

12. The display device according to claim 10, wherein the first switch and the second switch are disposed in at least one first transmission area adjacent to the normal area among the plurality of first transmission areas.

13. The display device according to claim 10, wherein the display area further comprises a second optical area that is different from the first optical area and the normal area, the display device further comprising:

a second optical electronic device located under, or in a lower portion of, the display panel, the second optical electronic device overlapping at least a portion of the second optical area, wherein the normal area is disposed or not disposed between the first optical area and the second optical area.

14. The display device according to claim 1, wherein the display panel comprises a first pixel area and a second pixel area in which a number of pixels per unit area in the second pixel area is less than a number of pixels per unit area in the first pixel area, and wherein the one or more of the plurality of pixels which are selectively supplied with the first body voltage and the second body voltage, are disposed in the second pixel area.

15. The display device according to claim 4, wherein the conductive layer overlaps the active layer of the driving transistor.

16. The display device according to claim 5, wherein the plurality of pixels operates in a data writing period and an emission period, and wherein the data writing period includes:

a first period in which the first initialization voltage is supplied to the third node;

a second period in which a voltage corresponding to a data signal and a threshold voltage of the driving transistor is written to the first node; and a third period in which the first initialization voltage is supplied to the third node.

17. A method of driving a display device comprising a plurality of pixels and operating in a data writing period and an emission period, the method comprising:

supplying a first body voltage to the plurality of pixels in the data writing period; and supplying a second body voltage that is different from the first body voltage to some of the plurality of pixels, and supplying the first body voltage to remaining pixels of the plurality of pixels in the emission period.

18. The method according to claim 17, wherein each of the plurality of pixels comprises:

a driving transistor;

a light emitting element configured to emit light by a driving current generated by the driving transistor;

a storage capacitor configured to maintain a voltage of a gate electrode of the driving transistor; and a conductive layer spaced apart from an active layer of the driving transistor, wherein the first body voltage and the second body voltage are supplied to respective conductive layers of the some of the plurality of pixels.

19. The method according to claim 18, wherein the driving transistor comprises a gate electrode, and first and second electrodes connected to first, second, and third nodes, respectively, and
- wherein each of the plurality of pixels further comprises:
- a first transistor connected between the first node and the third node, the first transistor turned on by a first gate signal;
- a second transistor connected between a data line and the second node, the second transistor turned on by a second gate signal;
- a third transistor connected between the second node and a pixel driving power line that transmits a same voltage as the first body voltage, the third transistor turned on by an emission signal;
- a fourth transistor connected between the third node and an anode electrode of the light emitting element, the fourth transistor turned on by the emission signal; and
- a fifth transistor disposed between the third node and a first initialization voltage line that transmits a first initialization voltage, and the fifth transistor turned on by a third gate signal.

20. The method according to claim 19, wherein the data writing period comprises:
- a first period in which the first initialization voltage is supplied to the third node;
- a second period in which a voltage corresponding to a data signal and a threshold voltage of the driving transistor is written to the first node; and
- a third period in which the first initialization voltage is supplied to the third node.

* * * * *